(12) United States Patent
Hashimoto et al.

(10) Patent No.: US 8,723,046 B2
(45) Date of Patent: May 13, 2014

(54) NARROW FRAME TOUCH INPUT SHEET WITH GOOD ANTICORROSION PROPERTY AND MANUFACTURING METHOD THEREOF

(75) Inventors: Takao Hashimoto, Kyoto (JP); Hirotaka Shigeno, Kyoto (JP); Takaaki Terawaki, Kyoto (JP); Kazuomi Teratani, Kyoto (JP); Shuzo Okumura, Kyoto (JP); Yoshihiro Sakata, Kyoto (JP); Takahiro Suzuki, Kyoto (JP)

(73) Assignee: Nissha Printing Co., Ltd., Kyoto (JP)

( * ) Notice: Subject to any disclaimer, the term of this patent is extended or adjusted under 35 U.S.C. 154(b) by 0 days.

(21) Appl. No.: 13/635,241

(22) PCT Filed: Jun. 20, 2011

(86) PCT No.: PCT/JP2011/064086
§ 371 (c)(1),
(2), (4) Date: Sep. 14, 2012

(87) PCT Pub. No.: WO2011/162221
PCT Pub. Date: Dec. 29, 2011

(65) Prior Publication Data
US 2013/0000954 A1 Jan. 3, 2013

(30) Foreign Application Priority Data

Jun. 22, 2010 (JP) ................................. 2010-141329
Nov. 19, 2010 (JP) ................................. 2010-259570
Nov. 19, 2010 (JP) ................................. 2010-259571
Dec. 20, 2010 (JP) ................................. 2010-283646

(51) Int. Cl.
*H05K 1/00* (2006.01)

(52) U.S. Cl.
USPC ............ 174/250; 174/255; 174/256; 174/257

(58) Field of Classification Search
USPC .................................. 174/250, 255, 256, 257
See application file for complete search history.

(56) References Cited

U.S. PATENT DOCUMENTS 4,753,368 A * 6/1988 Lescaut ...................... 220/62.22
8,414,783 B2 * 4/2013 Liu et al. ......................... 216/12
(Continued)

FOREIGN PATENT DOCUMENTS

JP 05-108264 A 4/1993
JP 2008-065748 A 3/2008
(Continued)

OTHER PUBLICATIONS

International Search Report of corresponding International Application No. PCT/JP2011/064086, dated on Sep. 20, 2011.
(Continued)

*Primary Examiner* — Timothy Thompson
*Assistant Examiner* — Andargie M Aychillhum
(74) *Attorney, Agent, or Firm* — Global IP Counselors, LLP

(57) ABSTRACT

A method of manufacturing a narrow frame touch input sheet having very good anticorrosion properties and suitable for a narrow frame capacitance type touch sensor having a double-layer transparent conductive film pattern. The method uses an electrical conductivity sheet obtained by sequentially forming transparent and light blocking conductive films, and first resist layers, on both sides of a transparent base sheet, exposing and developing the resist layers on both sides simultaneously, etching the transparent and light blocking films simultaneously, removing the resist layers, laminating second resist layers with anticorrosion agent on the revealed light blocking films, etching the light blocking films in center windows and terminal portions to reveal the transparent films, and side etching revealed end faces of the light blocking films at center window and terminal portion boundaries to create visor structured second resist layers that are heat softened as an anticorrosion layer on the revealed faces.

7 Claims, 13 Drawing Sheets

(56) References Cited

U.S. PATENT DOCUMENTS

| | | |
|---|---|---|
| 2008/0129317 A1 | 6/2008 | Oba |
| 2008/0176042 A1 | 7/2008 | Nashiki et al. |
| 2010/0194723 A1* | 8/2010 | Moriwaki .................... 345/206 |
| 2011/0099805 A1 | 5/2011 | Lee |

FOREIGN PATENT DOCUMENTS

| | | |
|---|---|---|
| JP | 2008-083495 A | 4/2008 |
| JP | 2009-076432 A | 4/2009 |
| JP | 2010-27033 A | 2/2010 |
| KR | 10-0909265 B1 | 7/2009 |
| WO | 2012-015703 A1 | 2/2012 |

OTHER PUBLICATIONS

Notice to Submit a Response of the corresponding Korean patent application No. 10-2012-7033079, dated Jun. 10, 2013.

The European Extended search report issued on Jan. 29, 2014 of the corresponding EP application.

* cited by examiner

NARROW FRAME TOUCH INPUT SHEET WITH GOOD ANTICORROSION PROPERTY AND MANUFACTURING METHOD THEREOF

CROSS-REFERENCE TO RELATED APPLICATIONS

This U.S. National stage application claims priority under 35 U.S.C. §119(a) to Japanese Patent Application No. 2010-141329, filed in Japan on Jun. 22, 2010, to Japanese Patent Application No. 2010-259571, filed in Japan on Nov. 19, 2010, to Japanese Patent Application No. 2010-259570, filed in Japan on Nov. 19, 2010 and to Japanese Patent Application No. 2010-283646, filed in Japan on Dec. 20, 2010, the entire contents of Japanese Patent Application No. 2010-141329, Japanese Patent Application No. 2010-259571, Japanese Patent Application No. 2010-259570 and Japanese Patent Application No. 2010-283646 are hereby incorporated herein by reference.

BACKGROUND

1. Field of the Invention

The present invention relates to a narrow frame touch input sheet that has a narrow frame and is suitable for a capacitance type touch sensor having a double-layer transparent conductive film pattern, and a manufacturing method of the same, which is excellent particularly in anticorrosion property.

2. Background Information

Conventionally, as disclosed in JP-A-5-108264, an invention is known for making a touch input device, in which metal films are formed on lead terminals of transparent electrodes, and then transparent electrode patterns in an input panel region and the metal films as well as the transparent electrodes of the lead terminals are etched simultaneously.

In the invention of the above-mentioned JP-A-5-108264, as illustrated in FIG. 9, a transparent electrode made of an ITO film 31 is formed on a polyester film 30, and a photoresist film 32 is formed and patterned on the ITO film 31. Next, the photoresist film 32 is covered with a mask 33, and then a metal film 34 made of In film is formed. Then, the mask 33 is removed, and the photoresist film 32 is removed by resist release liquid, so that the metal film 34 is patterned. After that, a second photoresist film 35 is formed and patterned on the patterned metal film 34 (see FIG. 9(e)), and the metal film 35 and the ITO film 31 are simultaneously removed by etching using ferric chloride solution or the like. Then, finally, the photoresist film 35 is removed by the resist release liquid.

SUMMARY

However, the method of JP-A-5-108264 has a problem that when the second photoresist film 35 is formed and patterned on the patterned metal film 34 of FIG. 9(e), if a position of the mask 33 is deviated even slightly, one metal film 34 becomes thin while the other metal film 34 becomes thick, and hence the metal film 34 does not have a desired electric resistance. Therefore, there is a problem that the method cannot be applied to a narrow frame touch input sheet in which the metal film 34 is a thin line and is required to have an electric resistance within a predetermined resistance range.

In addition, in the capacitance type touch input sheet, it is necessary to laminate a transparent conductive film pattern formed usually in an X direction and a transparent conductive film pattern formed in a Y direction via an insulating layer. Using the method of JP-A-5-108264, the metal film and the transparent electrode cannot be formed on both sides while being positioned. Therefore, there is a problem that it is necessary to make two touch input sheets and glue them to each other while positioning them so as to manufacture the touch input sheet. As a result, there are also problems of decreased productivity, decreased transmittance of a transparent window portion, and bulkiness due to an increase of the thickness.

Therefore, an object of the present invention is to solve the above-mentioned problems and to provide a narrow frame touch input sheet that has a narrow frame and is suitable for a capacitance type touch sensor having a double-layer transparent conductive film pattern, and further has a good anticorrosion property, and to provide a manufacturing method of the touch input sheet.

Therefore, the inventors created the following invention to solve the above-mentioned problems. According to a first aspect of the present invention, there is provided a narrow frame touch input sheet having a good anticorrosion property, including a transparent base sheet having a center window on both sides, an electrode pattern of a transparent conductive film formed in the windows on both sides, and a fine wiring circuit patterns for the electrode patterns formed on both sides of an outer frame of the base sheet, in which the electrode patterns and the fine wiring circuit patterns are different between both sides, and at least the fine wiring circuit patterns, except a terminal portion thereof, on at least one side is covered with a transparent anticorrosion layer.

In addition, according to a second aspect of the present invention, there is provided a narrow frame touch input sheet having a good anticorrosion property of the first aspect, in which each of the fine wiring circuit pattern includes a transparent conductive film and a light blocking conductive film that are laminated in order.

In addition, according to a third aspect of the present invention, there is provided a narrow frame touch input sheet having a good anticorrosion property of the first aspect or the second aspect, in which the transparent anticorrosion layer is formed to cover also the electrode pattern.

In addition, according to a fourth aspect of the present invention, there is provided a narrow frame touch input sheet having a good anticorrosion property of any one of the first to third aspects, in which the transparent anticorrosion layer is made of thermosetting resin or photo-setting resin.

In addition, according to a fifth aspect of the present invention, there is provided a narrow frame touch input sheet having a good anticorrosion property of any one of the first to fourth aspects, in which the base sheet has a two-layer structure.

In addition, according to a sixth aspect of the present invention, there is provided a narrow frame touch input sheet having a good anticorrosion property of any one of the first to fifth aspects, further including an external circuit on which IC chips are mounted, the external circuit are connected to the terminal portion of the fine wiring circuit pattern, so that the touch input sheet functions as a capacitance type touch sensor.

In addition, according to a seventh aspect of the present invention, there is provided a method for manufacturing a narrow frame touch input sheet having a good anticorrosion property, including:

sequentially forming a transparent conductive film, a light blocking conductive film, and a first resist layer on both sides of a transparent base sheet;

partially exposing the first resist layer on each sides simultaneously and developing the first layer so as to pattern the first resist layer;

etching and removing the transparent conductive film and the light blocking conductive film simultaneously in a part where the patterned first resist layer is not laminated, so as to form an electrode pattern in center windows on both sides of the base sheet, in which the transparent conductive film and the light blocking conductive film are laminated without misregistration, and to form a fine wiring circuit pattern in outer frames on both sides of the base sheet, in which the transparent conductive film and the light blocking conductive film are laminated without misregistration;

removing the first resist layer and then laminating a patterned second resist layer on the revealed light blocking conductive film;

etching and removing only a part of the light blocking conductive film on which the patterned second resist layer is not laminated, so as to reveal the transparent conductive film in the center window and the terminal portion on both sides of the base sheet; and forming a transparent anticorrosion layer to cover at least the fine wiring circuit pattern, except the terminal portion, on at least one side after removing the second resist layer.

In addition, according to an eighth aspect of the present invention, there is provided a method for manufacturing a narrow frame touch input sheet having a good anticorrosion property, including:

sequentially laminating a transparent conductive film, a light blocking conductive film, and a first resist layer on both sides of a transparent base sheet;

partially exposing the first resist layers on both sides simultaneously and developing the first resist layer so as to pattern the first resist layer;

etching and removing the transparent conductive film and the light blocking conductive film simultaneously in a part where the patterned first resist layer is not laminated, so as to form an electrode pattern in center windows on both sides of the base sheet, in which the transparent conductive film and the light blocking conductive film are laminated without misregistration, and to form a fine wiring circuit pattern in outer frames on both sides of the base sheet, in which the transparent conductive film and the light blocking conductive film are laminated without misregistration;

removing the first resist layer and then laminating a patterned second resist layer with anticorrosion agent on the revealed light blocking conductive film; and etching and removing only a part of the light blocking conductive film on which the patterned second resist layer is not laminated, so as to reveal the transparent conductive films in the center window and terminal portion on both sides of the base sheet, and keeping the second resist layer in the same state as an anticorrosion layer without removing the second resist layer.

In addition, according to a ninth aspect of the present invention, there is provided a method for manufacturing a narrow frame touch input sheet having a good anticorrosion property, including:

sequentially laminating a transparent conductive film, a light blocking conductive film, and a first resist layer on both sides of a transparent base sheet;

partially exposing the first resist layer on both sides simultaneously and developing the first resist layer so as to pattern the first resist layer;

etching and removing the transparent conductive film and the light blocking conductive film simultaneously in a part where the patterned first resist layer is not laminated, so as to form an electrode pattern in center windows on both sides of the base sheet, in which the transparent conductive film and the light blocking conductive film are laminated without misregistration, and to form a fine wiring circuit pattern in outer frames on both sides of the base sheet, in which the transparent conductive film and the light blocking conductive film are laminated without misregistration;

removing the first resist layer and then laminating a patterned second resist layer with anticorrosion agent on the revealed light blocking conductive film;

etching and removing only a part of the light blocking conductive film on which the patterned second resist layer is not laminated so as to reveal the transparent conductive film in the center window and a terminal portion on both sides of the base sheet, and further performing side etching of a revealed end face of the light blocking conductive film at a boundary between the center window and the terminal portion so as to make a visor structure of the second resist layer; and softening the second resist layer of the visor structure by heat treatment so as to cover the revealed end face with the remaining light blocking conductive film, and keeping the second resist layer in the same state as an anticorrosion layer without removing the second resist layer.

In addition, according to a tenth aspect of the present invention, there is provided a method for manufacturing a narrow frame touch input sheet having a good anticorrosion property of any one of the seventh to ninth aspect, in which the transparent base sheet includes a laminated body of a plurality of resin sheets, the transparent conductive film and the light blocking conductive film are formed on the uppermost and lowermost resin sheets in advance before the resin sheets are laminated, and the first resist layer is formed after the resin sheets are laminated.

In addition, according to a eleventh aspect of the present invention, there is provided a method for manufacturing a narrow frame touch input sheet having a good anticorrosion property of any one of the seventh to ninth aspects, in which the transparent base sheet includes a laminated body of a plurality of resin sheets, the transparent conductive film is formed on the uppermost and lowermost resin sheets in advance before the resin sheets are laminated, and the light blocking conductive film and the first resist layer are formed after the resin sheets are laminated.

In addition, according to a twelfth aspect of the present invention, there is provided a method for manufacturing a narrow frame touch input sheet having a good anticorrosion property of any one of the seventh to eleventh aspects, in which the anticorrosion agent added to the second resist layer is any one of imidazole, triazole, benzotriazole, benzimidazole, benzothiazole, and pyrazole.

In addition, according to a thirteenth aspect of the present invention, there is provided a method for manufacturing a narrow frame touch input sheet having a good anticorrosion property, including:

obtaining a conductive film having a transparent conductive film, a light blocking conductive film, and a first photoresist layer that are sequentially laminated on the entire surface of each side of a transparent base sheet;

partially exposing the first photoresist layers on both sides simultaneously and developing the first photoresist layer so as to pattern the first photoresist layer;

etching and removing the transparent conductive film and the light blocking conductive film simultaneously in a part where the patterned first photoresist layer is not laminated, so as to form electrode patterns in center windows on both sides of the base sheet, in which the transparent conductive film and the light blocking conductive film are laminated without misregistration, and to form fine wiring circuit patterns in outer frames on both sides of the base sheet, in which the transparent conductive film and the light blocking conductive film are laminated without misregistration;

removing the first photoresist layer and then laminating a second photoresist layer on the entire surface on which the electrode patterns and the fine wiring circuit patterns are formed;

partially exposing the second photoresist layer on both sides simultaneously and developing the second photoresist layer so as to pattern the second photoresist layer;

etching and removing only a part of the light blocking conductive film on which the patterned second photoresist layer is not laminated, so as to reveal the transparent conductive films in the center window and a terminal portion on both sides of the base sheet; and removing the second photoresist layer and then covering the revealed light blocking conductive film with an anticorrosion functional film.

In addition, according to a fourteenth aspect of the present invention, there is provided a method for manufacturing a narrow frame touch input sheet having a good anticorrosion property of the thirteenth aspect, in which the anticorrosion functional film is formed by a printing method.

In addition, according to a fifteenth aspect of the present invention, there is provided a method for manufacturing a narrow frame touch input sheet having a good anticorrosion property of the thirteenth aspect in which the anticorrosion functional film is formed by a photoprocess.

In addition, according to a sixteenth aspect of the present invention, there is provided a method for manufacturing a narrow frame touch input sheet having a good anticorrosion property of any one of thirteenth to fifteenth aspects, in which each of the transparent conductive films is an ITO film, and each of the light blocking conductive films is a copper foil.

As described above, the narrow frame touch input sheet of the present invention includes a transparent base sheet having center windows on both sides, electrode patterns of transparent conductive films formed in the windows, fine wiring circuit patterns for the electrode patterns formed on both sides of an outer frame of the base sheet, in which the electrode patterns and the fine wiring circuit patterns are different between both sides, and the fine wiring circuit patterns except a terminal portion are covered with a transparent anticorrosion layer. Therefore, there is an effect that it has an excellent anticorrosion property.

More specifically, for example, supposing that a simple second resist layer without an anticorrosion agent is not removed and remained on the fine wiring circuit patterns. Because this second resist layer is inferior in anticorrosion property, after the product is completed, if corrosive liquid such as sweat or salt water enters from the outside, or even under a test environment such as high temperature and high humidity, corrosion of the wiring circuit may proceed, and electric characteristics are deteriorated as a problem. In contrast, because the anticorrosion layer covers the fine wiring circuit patterns in the present invention, even if corrosive liquid enters from the outside after the product is completed, or even under a test environment such as high temperature and high humidity, corrosion of the wiring circuit does not proceed, so that electric characteristics can be maintained. Therefore, the present invention can be used appropriately also in an application such as a narrow frame touch input sheet used for a capacitance type touch sensor or the like, in which the wiring circuit is formed of thin lines and is required to maintain a low resistance for a long period.

In addition, in a manufacturing method of a narrow frame touch input sheet, when an anticorrosion agent is added to the second resist layer, which is not removed but is remained as an anticorrosion layer, the second resist layer functions also as the anticorrosion layer. Therefore, it is not necessary to add a step of forming the anticorrosion layer separately from the second resist layer. Because fewer components are required, cost can be low. Further, because another anticorrosion layer is not formed separately from the second resist layer, positional accuracy with respect to the fine wiring circuit pattern of the anticorrosion region can be improved.

In addition, because the fine wiring circuit patterns are formed so that the two-layer structure of the transparent conductive film and the light blocking conductive film, except the terminal portion, is covered with the anticorrosion functional film, low resistance is maintained for a long period, and electrical connection with an FPC can be maintained at the terminal portion by removing the light blocking conductive film.

BRIEF DESCRIPTION OF THE DRAWINGS

FIG. 2(*b*) is a schematic diagram illustrating the process for manufacturing the narrow frame touch input sheet of FIG. 1.

FIG. 2(*c*) is a schematic diagram illustrating the process for manufacturing the narrow frame touch input sheet of FIG. 1.

FIG. 2(*d*) is a schematic diagram illustrating the process for manufacturing the narrow frame touch input sheet of FIG. 1.

FIG. 2(*e*) is a schematic diagram illustrating the process for manufacturing the narrow frame touch input sheet of FIG. 1.

FIG. 2(*f*) is a schematic diagram illustrating the process for manufacturing the narrow frame touch input sheet of FIG. 1.

FIG. 2(*g*) is a schematic diagram illustrating the process for manufacturing the narrow frame touch input sheet of FIG. 1.

FIG. 6(*b*) is a schematic cross sectional view illustrating the process for manufacturing the narrow frame touch input sheet of FIG. 5.

FIG. 6(*c*) is a schematic cross sectional view illustrating the process for manufacturing the narrow frame touch input sheet of FIG. 5.

FIG. 6(*d*) is a schematic cross sectional view illustrating the process for manufacturing the narrow frame touch input sheet of FIG. 5.

FIG. 6(*e*) is a schematic cross sectional view illustrating the process for manufacturing the narrow frame touch input sheet of FIG. 5.

DESCRIPTION OF EMBODIMENTS

Hereinafter, a preferred embodiment of the present invention is described with reference to the drawings.

First Embodiment

Figure 1:
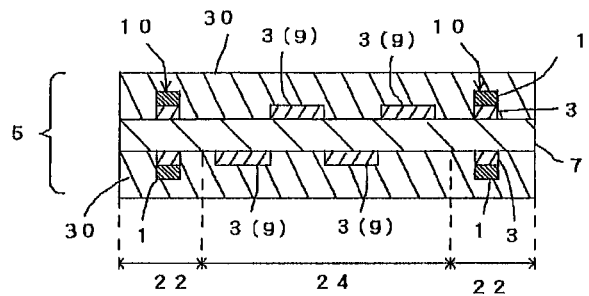
FIG. 1 is a schematic cross sectional view illustrating an example of a narrow frame touch input sheet according to the present invention.
Figure 2A:
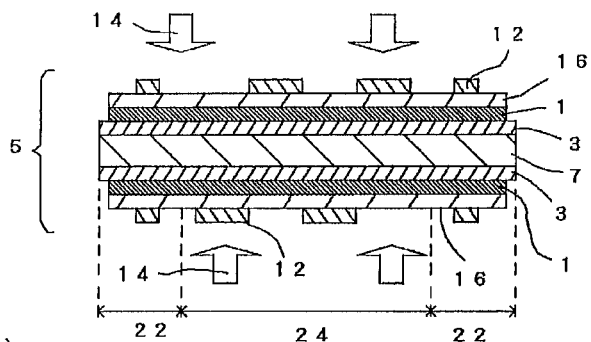
FIG. 2(*a*) is a schematic diagram illustrating a process for manufacturing the narrow frame touch input sheet of FIG. 1.
Figure 2B:
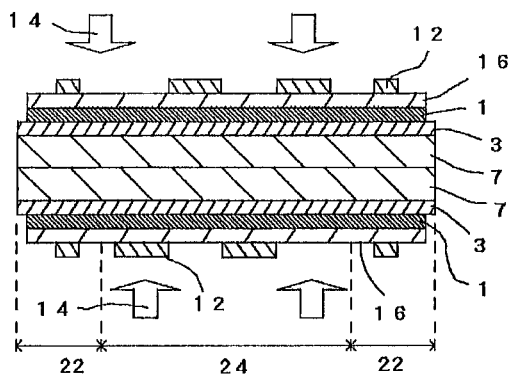
Figure 2C:
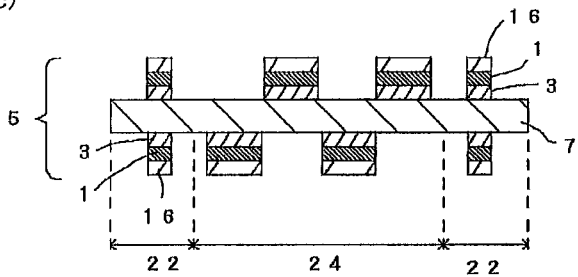
Figure 2D:
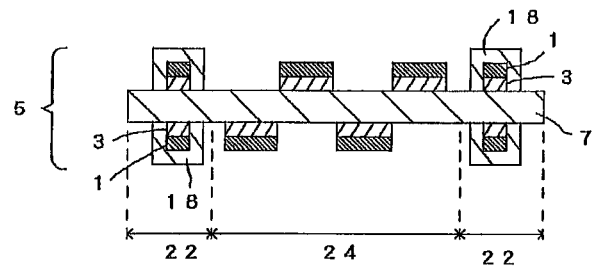
Figure 2E:
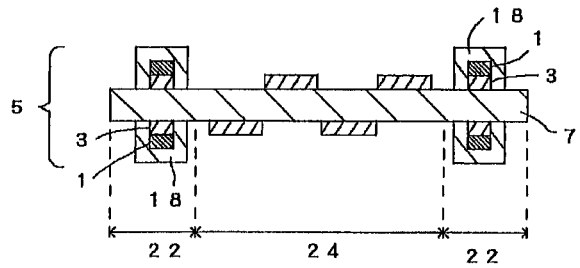
Figure 2F:
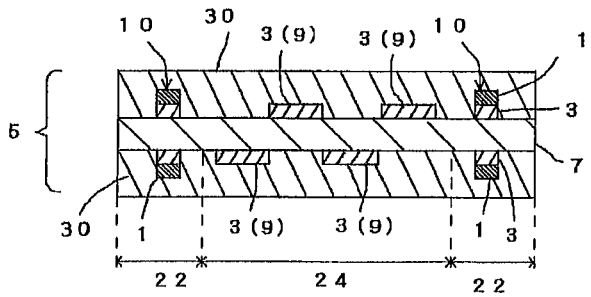
Figure 2G:
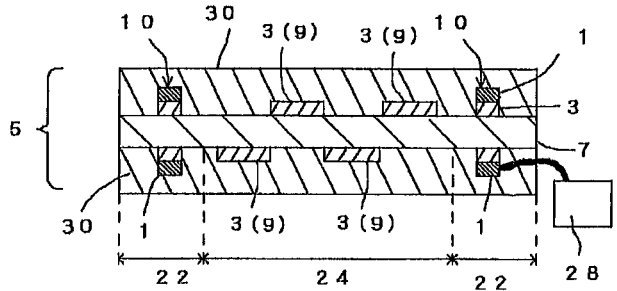

A narrow frame touch input sheet 5 has a good anticorrosion property illustrated in FIG. 1 includes a base sheet made of a transparent resin sheet 7 having center windows 24 on both sides, electrode patterns 9 made of a transparent conductive film 3 formed in the center windows 24, and transparent conductive films 3 and light blocking conductive films 1 laminated, in order, so as to form fine wiring circuit patterns 10 in an outer frame 22. The electrode patterns 9 and the fine wiring circuit patterns 10 are different between both sides. On both sides, the electrode patterns 9 and the fine wiring circuit patterns 10 except a terminal portion are covered with a transparent anticorrosion layer 30.

Here, the electrode pattern 9 and the fine wiring circuit pattern 10 are different between both sides because a shape and an arrangement of the electrode pattern of the capacitance type touch sensor are as follows. Specifically, the electrode patterns 9 are disposed are disposed such that X electrodes x1, x2, x3, and so on are disposed on one surface and Y electrodes y1, y2, y3, and so on are disposed on the other surface. The X electrodes x1, x2, x3, and so on are arranged in parallel and have a structure in which many squares are arranged so that opposite two corners thereof are disposed in a longitudinal direction of the electrodes. In addition, Y electrodes y1, y2, y3, and so on are similarly arranged in parallel and have a structure in which many squares are arranged so that opposite two corners thereof are disposed in a longitudinal direction of the electrodes. Thus, squares are arranged so as to fill an input surface of the center window 24 with slight gaps remained.

A manufacturing method of the narrow frame touch input sheet 5 in which the electrode patterns 9 and the fine wiring circuit patterns 10 of the transparent conductive films 3 are formed on both sides as described above is as follows. First, the transparent conductive film 3, a light blocking conductive film 1, and a first resist layer 16 are formed in order on the entire surface on the front and back sides of the base sheet made of the resin sheet 7. Then, masks 12 having desired patterns are placed on both sides, and exposure and development are performed so that the first resist layers 16 are patterned (see FIG. 2(*a*)). Alternatively, two thin resin sheets 7 are used, and the transparent conductive film 3, the light blocking conductive film 1, and the first resist layer 16 are formed in order on the entire surface on one side of each sheet. Then, the two resin sheets 7 are laminated to be opposed to each other and to make a base sheet. Then, the masks 12 having desired patterns are placed on the front and back sides of the base sheet, and the exposure and development are performed so that the first resist layers 16 are patterned to make the narrow frame touch input sheet 5 (see FIG. 2(*b*)). In this case, the light blocking conductive film 1 blocks exposing light rays 14 from the opposite side. Therefore, even if the exposure is performed on both sides with different mask patterns, exposure on one side does not affect patterns of the first resist layer 16 on the opposite side. Note that, as the means for laminating the resin sheets 7, there are thermal lamination, dry lamination using adhesive, and the like.

Next, using etching liquid such as ferric chloride, the transparent conductive film 3 and the light blocking conductive film 1 are simultaneously etched so that fine patterns are formed (see FIG. 2(*c*)). Next, using resist release liquid, the first resist layer 16 is removed so that the light blocking conductive film 1 is revealed. Then, a second resist layer 18 is formed on the revealed light blocking conductive film 1 only in the part of the outer frame 22 (see FIG. 2(*d*)). Next, when etching with a special etching liquid such as acidified hydrogen peroxide, the outer frame 22 on which the second resist layer 18 is formed remains as it is, while in the center window 24 on which the second resist layer 18 is not formed so that the light blocking conductive film 1 is revealed, the light blocking conductive film 1 is etched and removed so that the transparent conductive film 3 thereunder is revealed to make the electrode pattern 9 (see FIG. 2(*e*)). The center window 24 becomes a display portion having transparent conductive films formed on both sides, while the light blocking conductive film 1 formed on the outer frame 22 and the transparent conductive film 3 formed under the light blocking conductive film 1 with the same pattern become the fine wiring circuit pattern 10.

However, in this state, the electrode pattern 9 of the transparent conductive film 3 is revealed in the center window, and the second resist layer 18 may be slightly deteriorated or swelled by the special etching liquid so that the transparent conductive film 3 and the light blocking conductive film 1 cannot be protected sufficiently for a long period. In addition, the terminal portion of the fine wiring circuit pattern 10 is covered with the second resist layer 18. Therefore, in the present invention, after removing the second resist layer, the electrode pattern 9 and the fine wiring circuit pattern 10, except the terminal portion, are covered with the transparent anticorrosion layer 30 so that the transparent conductive film 3 and the light blocking conductive film 1 can be protected more (see FIG. 2(*f*).

Then, the terminal portions of the fine wiring circuit patterns 10, which are formed on both sides of the narrow frame touch input sheet 5 having a good anticorrosion property obtained by the above-mentioned method, are connected via a flexible printed circuit (FPC) to an external circuit 28 on which IC chips are mounted. Thus, a capacitance type touch sensor including transparent conductive films 3 formed on both sides of the base sheet is manufactured (see FIG. 2(*g*)).

Next, the individual layers forming the narrow frame touch input sheet 5 are described in detail. First, the base sheet is made of a transparent sheet having a thickness of approximately 30 to 2,000 μm, and, as its material, there may be the resin sheet 7 such as polyester resin, polystyrene resin, olefin resin, polybutylene terephthalate resin, polycarbonate resin, and acrylic resin, various types of glass, and the like.

The light blocking conductive film 1 may be a layer made of a single metal film having high electrical conductivity and a good light blocking property, or a layer made of an alloy or a compound thereof, and can be formed by a vacuum deposition method, a sputtering method, an ion plating method, a plating method, or the like. Further, it is necessary to have an etchant that does not etch the transparent conductive film but etches the light blocking conductive file 1 itself. As an example of the preferred metal, there are aluminum, nickel, copper, silver, and the like. In particular, a metal film made of copper foil having a thickness of 30 to 1,000 nm is further preferable because it has a good electrical conductivity and light blocking property, and because the transparent conductive film can be easily etched by hydrogen peroxide water in an non-etchable acid atmosphere, and because it is also easy to connect to the external circuit.

The transparent conductive film 3 may be a layer made of metal oxide such as indium tin oxide, zinc oxide, and the like, and can be formed by a vacuum deposition method, a sputtering method, an ion plating method, a plating method, or the like. The thickness is approximately a few tens to a few hundreds nanometers. It is necessary that the transparent conductive film 3 is easily etched in a solution of ferric chloride or the like together with the light blocking conductive film 1, but cannot be easily etched by the etching liquid of the light blocking conductive film 1 such as the hydrogen peroxide water in the acid atmosphere. Further, it is preferred that the transparent conductive film 3 has a light transmittance of 80% or higher and a surface resistance of a few milliohms to a few hundreds ohms.

As the anticorrosion layer 30, there are thermosetting resins such as epoxy resin, urethane resin, and acrylic resin, and ultraviolet curing resins such as urethane acrylate resin, cyanoacrylate resin, and the like. The anticorrosion layer 30 is formed by a general printing method such as a gravure printing, screen printing, offset printing, and the like, various coating methods, a painting method, a dipping method, and the like. In addition, in the present invention, covering or coating of the electrode pattern 9 and the fine wiring circuit pattern 10 means covering not only the upper surfaces but also the side surfaces of the electrode pattern 9 and the fine wiring circuit pattern 10.

Figure 3:
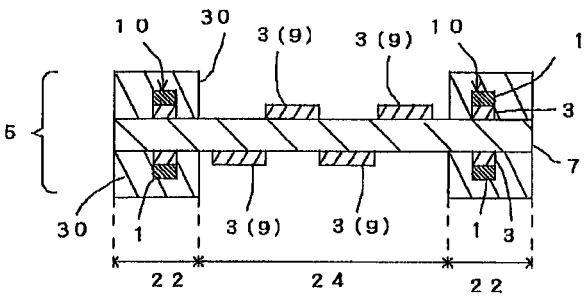
FIG. 3 is a schematic cross sectional view illustrating another example of the narrow frame touch input sheet according to the present invention.

Note that in the embodiment illustrated in FIG. 1, the anticorrosion layer 30 is disposed on the electrode pattern 9 and the fine wiring circuit pattern 10. However, it is possible to cover only the fine wiring circuit pattern 10 with the anticorrosion layer 30 (see FIG. 3). In this case too, the fine wiring circuit pattern 10 can maintain its electric resistance within a predetermined range for a long period. However, the embodiment illustrated in FIG. 1 is more preferred because the transparent electrode can also maintain its electric resistance within a predetermined range for a long period. In order to cover only the fine wiring circuit pattern 10 with the anticorrosion layer 30, the anticorrosion layer 30 may be formed directly and partially by the above-mentioned method and then may be cured, or it may be formed entirely and then irradiated partially with ultraviolet rays to be cured, and the non-irradiated parts may be removed after that.

In addition, in the embodiment illustrated in FIG. 1, the transparent anticorrosion layers 30 are formed on both sides of the narrow frame touch input sheet 5. However, it is possible to form the transparent anticorrosion layer 30 only on one side of the narrow frame touch input sheet 5. For instance, if the narrow frame touch input sheet 5 is glued onto a glass plate or a resin plate, the glued side of the narrow frame touch input sheet 5 is protected by the glass plate or the resin plate. Therefore, it is sufficient to protect only the side opposite to the glued side with the anticorrosion layer 30.

As the first resist layer 16, it is preferred to use a photoresist material such as novolac resin or tetramethylammonium hydroxide that can be exposed with a laser beam or a metal halide lamp and can be developed by alkali solution or the like. It is because the fine wiring circuit pattern 10 having a thin width can be reliably formed by exposure and development using the photoresist material. In addition, in the present invention, because the light blocking conductive film 1 is formed as described above, if the first resist layer 16 is made of the photoresist material, the exposure and development of the front and back sides can be performed simultaneously. Thus, the narrow frame touch input sheet 5 can be manufactured with a very good productivity. It is preferred to form the first resist layer 16 by a general printing method such as gravure printing, screen printing, or offset printing, various coating methods, a painting method, a dipping method, or the like.

Material of the second resist layer 18 is not limited particularly as long as it has resistance to the etching liquid of the light blocking conductive film 1 such as the hydrogen peroxide water in an acid atmosphere. The forming method and the thickness can be the same as those of the first resist layer 16.

Note that as the photoresist material, there are two types, namely a "positive type" in which the exposed part is dissolved, and a "negative type" in which the exposed part remains. The positive type is advantageous for fine patterns, but the present invention is not limited to the positive type as long as a desired pattern of resist can be obtained.

Note that the fine wiring circuit pattern 10 has a structure in which the transparent conductive film 3 and the light blocking conductive film 1 are laminated in the embodiment illustrated in FIG. 1, but the fine wiring circuit pattern 10 may be formed of only the transparent conductive film 3. However, it is more preferred to laminate the light blocking conductive film 1 such as copper foil for compensating electrical conductivity of the transparent conductive film 3.

Second Embodiment

Figure 4:
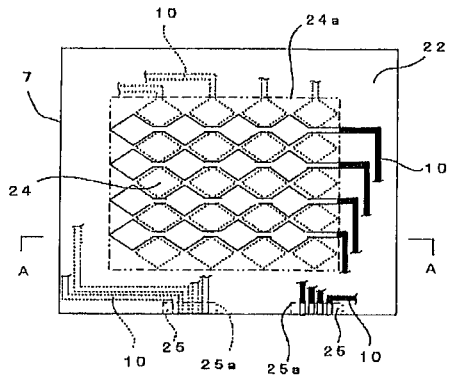
FIG. 4 is a diagram illustrating electrode patterns and fine wiring circuit patterns of an example of the narrow frame touch input sheet according to the present invention.
Figure 5:
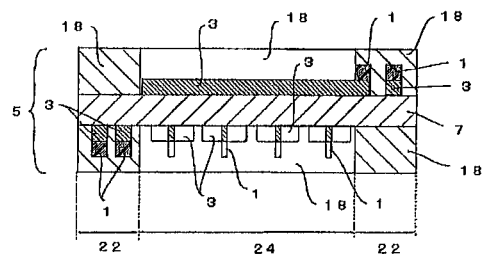
FIG. 5 is a schematic cross sectional view illustrating an example of the narrow frame touch input sheet in which the electrode patterns and the fine wiring circuit patterns are formed on both sides of a transparent base sheet made of a resin sheet.
Figure 6A:
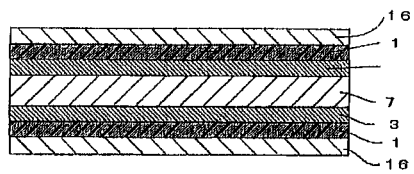
FIG. 6(*a*) is a schematic cross sectional view illustrating a process for manufacturing the narrow frame touch input sheet of FIG. 5.
FIG. 6(f) is a schematic cross sectional view illustrating the process for manufacturing the narrow frame touch input sheet of FIG. 5.
Figure 6B:
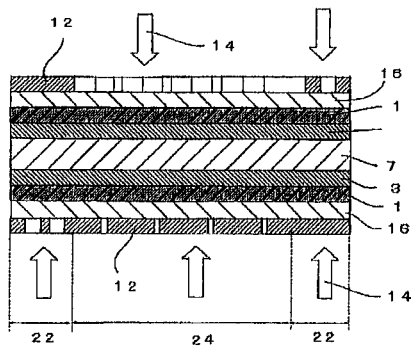
Figure 6C:
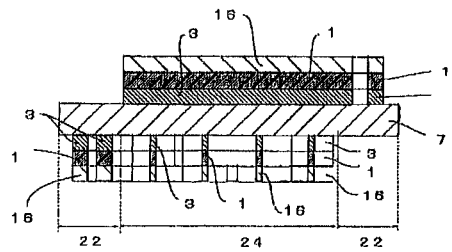
Figure 6D:
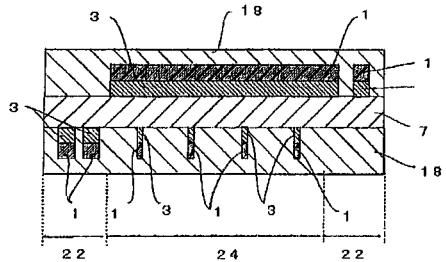
Figure 6E:
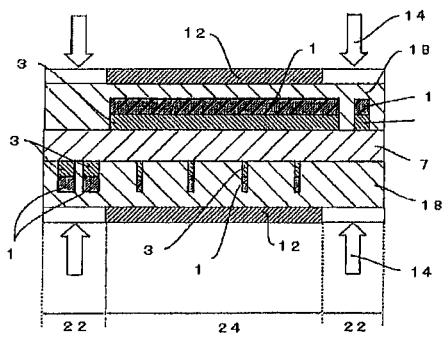
Figure 6F:
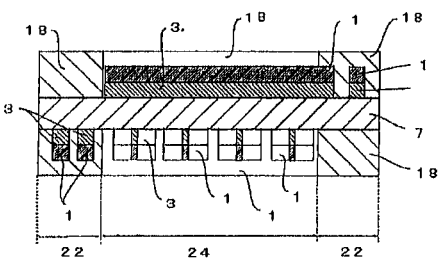

Hereinafter, with reference to the drawings, a second embodiment of the present invention is described in detail. FIG. 4 is a diagram illustrating the electrode patterns and the fine wiring circuit patterns of an example of the narrow frame touch input sheet according to the present invention. FIG. 5 is a schematic cross sectional view illustrating an example of the narrow frame touch input sheet in which the electrode patterns and the fine wiring circuit patterns are formed on both sides of a transparent base sheet made of a resin sheet (taken along line AA illustrated in FIG. 4; the number of fine wiring circuit patterns is reduced). FIGS. 6(a) to 6(f) are schematic cross sectional views illustrating a manufacturing process thereof. In the figures, numeral 1 denotes a light blocking conductive film layer, numeral 3 denotes a transparent conductive film, numeral 5 denotes a narrow frame touch input sheet, numeral 7 denotes a resin sheet, numeral 9 denotes an electrode pattern, numeral 10 denotes a fine wiring circuit pattern, numeral 12 denotes a mask, numeral 14 denotes exposing light rays, numeral 16 denotes a first resist layer, numeral 18 denotes a second resist layer (and anticorrosion layer), numeral 20 denotes a capacitance type touch sensor, numeral 22 denotes the outer frame of the narrow frame touch input sheet 5, and numeral 24 denotes the center window of the narrow frame touch input sheet 5.

The narrow frame touch input sheet 5 obtained by the present invention includes a base sheet having the center windows 24 on both sides, the electrode patterns 9 made of only the transparent conductive film 3 formed in the center windows 24, the outer frame 22 on which the transparent conductive film 3 and the light blocking conductive film 1 are laminated, in order, so as to form the fine wiring circuit pattern 10 (see FIG. 4). The transparent conductive film 3 and the light blocking conductive film 1 of the fine wiring circuit pattern 10 are laminated in the same pattern without misregistration. Further, the transparent base sheet on which the electrode pattern 9 and the fine wiring circuit pattern 10 are formed can be constituted of one resin sheet 7 (see FIG. 5).

A manufacturing method of the narrow frame touch input sheet 5, in which the electrode patterns 9 and the fine wiring circuit pattern 10 of the transparent conductive film 3 are formed on both sides, includes the following steps. First, the transparent conductive film 3, the light blocking conductive film 1, and the first resist layer 16 are formed, in order, on the entire surface on both the front and back sides of the transparent base sheet made of one resin sheet 7 so as to obtain an electrical conductivity sheet (see FIG. 6(a)). Then, the masks 12 having desired patterns are placed on the front and back sides, and exposure (see FIG. 6(b)) and development are performed so as to pattern the first resist layer 16. In this case, the light blocking conductive film 1 blocks the exposing light rays 14 from the opposite side. Therefore, even if the exposure is performed simultaneously on both sides with different mask patterns, the exposure on one side does not affect the pattern of the first resist layer 16 on the opposite side. Therefore, because both sides can be exposed simultaneously, registration of the first resist layers 16 on the front and back sides can be performed easily, and patterning of both sides can be performed in one step so that productivity can be improved. Note that the position of the mask 12 illustrated in FIG. 6(b) indicates a case where the first resist layer 16 is a negative type (when it is exposed, its solubility is decreased with respect to developing solution so that an exposed part remains after development). If a positive type (when it is exposed, its solubility is increased with respect to the developing solution so that the exposed part is removed) is used, the parts shielded from light by the mask would be opposite.

Note that alignment between the front mask and the rear mask can be performed by using a known mask alignment method of a double-side exposing apparatus. For instance, an alignment method between the front mask and the rear mask is as follows. Mask alignment marks are formed on the front mask and the rear mask, and an optical reading sensor such as a camera reads an overlaid state of the pair of mask alignment marks so as to obtain relative positional information between the front mask and the rear mask. Then, based on the obtained positional information, a mask position adjustment mechanism moves the front mask and the rear mask relatively to each other so that the pair of mask alignment marks are overlaid correctly.

Next, using the etching liquid such as ferric chloride, the transparent conductive film 3 and the light blocking conductive film 1 are simultaneously etched so that the transparent conductive film 3 and the light blocking conductive film 1 of the part on which the first resist layer 16 after patterning is not laminated are removed. Thus, the transparent conductive film 3 and the light blocking conductive film 1 are laminated without misregistration to form the electrode pattern 9 in the center window on both sides of the base sheet, and the transparent conductive film 3 and the light blocking conductive film 1 are laminated without misregistration to form the fine wiring circuit pattern 10 on the outer frame on both sides of the base sheet (see FIG. 6(c)).

Next, using the resist release liquid, the first resist layer 16 is removed so that the light blocking conductive film 1 is revealed. Then, the second resist layer 18 with the anticorrosion agent added is formed on the entire surface of the revealed light blocking conductive film 1 (see FIG. 6(d)). After that, the masks 12 are placed on the second resist layer 18, and exposure (see FIG. 6(e)) and development are performed so as to pattern the second resist layer 18 (see FIG. 6(f)). Note that the position of the mask 12 illustrated in FIG. 6(e) indicates a case where the second resist layer 18 is a negative type (when it is exposed, its solubility is decreased with respect to developing solution so that an exposed part remains after development).

Note that if the transparent conductive film 3 is an amorphous material, it is preferred to crystallize the transparent conductive film 3 by a method of heat treatment or the like before the etching. It is because etching resistance is improved by the crystallization so that only the light blocking property metal film 1 may be selectively etched more easily.

End portions of the fine wiring circuit patterns 10 formed on both sides of the narrow frame touch input sheet 5 obtained by the method described above are connected, at the terminal portion 25, to the external circuit on which the IC chips are mounted. Thus, a capacitance type touch sensor 20 is manufactured, in which the transparent conductive film 3 are formed on both sides of the base sheet.

Here, the electrode pattern 9 formed in the center window 24 of the capacitance type touch sensor 20 is supplementarily described.

Figure 10:
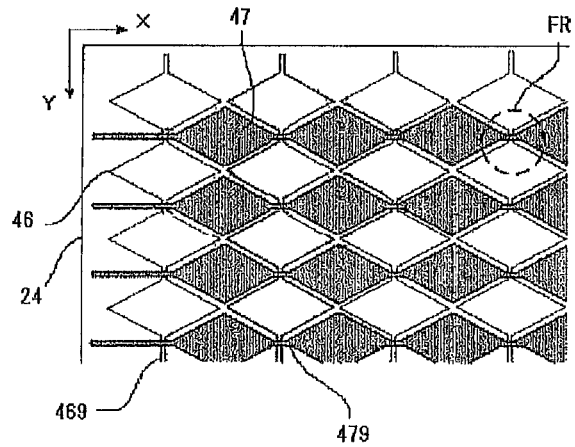
FIG. 10 is a plan view illustrating an example of a shape and an arrangement of electrode patterns formed in a center window of the narrow frame touch input sheet.

The electrode patterns 9 have different patterns between the front and back sides. For instance, as illustrated in FIG. 10, on the backside of the base sheet (resin sheet 7), rhombus electrodes 46 having a rhombus shape in a plan view are disposed, and connection wirings 469 are arranged to penetrate a plurality of rhombus electrodes 46 in the vertical direction (Y direction) in the figure. The plurality of rhombus electrodes 46 and the connection wiring 469 are electrically connected to each other. In addition, there are a plurality of sets of the connection wiring 469 and a plurality of rhombus electrodes 46 penetrated thereby arranged repeatedly in the horizontal direction (X direction) in the figure. On the other hand, similarly to this, a plurality of rhombus electrodes 47 are disposed and connection wirings 479 are arranged to penetrate them on the front side of the base sheet (resin sheet 7). However, in this case, the extending direction of the connection wiring 479 is different from that of the connection wiring 469 and is the horizontal direction (X direction) in the figure. In addition, in accordance with this, the direction in which the sets of the connection wiring 479 and the plurality of rhombus electrodes 47 penetrated thereby are arranged repeatedly is the vertical direction (Y direction) in the figure. Further, as apparent from FIG. 10, the rhombus electrodes 46 are disposed to fill spaces between the plurality of connection wirings 479, while the rhombus electrodes 47 are disposed to fill spaces between the plurality of connection wirings 469. Further in FIG. 10, the rhombus electrodes 46 and the rhombus electrodes 47 are arranged in a complementary manner. In other words, when the rhombus electrodes 46 are arranged in a matrix, rhombus spaces are generated, and the plurality of rhombus electrodes 47 are arranged to fill the rhombus spaces. As described above, in the present invention, the light blocking conductive film 1 blocks the exposing light rays 14 from the opposite side. Therefore, even if the exposure is performed on both sides simultaneously, exposure on one side does not affect patterns of the first resist layer 16 on the opposite side. Thus, different circuit patterns can be formed on the front side and the backside.

In this way, because the X direction electrodes and the Y direction electrodes are arranged to form a lattice in a plan view, when a user's finger or the like touches a position on the lattice (for example, a position indicated by broken line circle FR), a capacitor is formed between the finger or the like and the X direction electrode touched thereby. In addition, a capacitor is formed between the finger or the like and the Y direction electrode touched thereby. When the capacitors are formed, capacitances of the X direction electrode and the Y direction electrode increase. A position detection unit of the external circuit detects the amount of variation of the capacitance generated in this case, or further detects the X direction electrode and the Y direction electrode having the maximum capacitance, so as to obtain the touched position in the center window 24 as a specified value that is a set of an X coordinate and a Y coordinate.

Next, the individual layers constituting the narrow frame touch input sheet 5 of the second embodiment are described in detail.

First, the base sheet is made of a transparent sheet having a thickness of approximately 30 to 2,000 μm, and its material may be the resin sheet 7 of polyester resin, polystyrene resin, olefin resin, polybutylene terephthalate resin, polycarbonate resin, acrylic resin, or the like. Note that the base sheet may be made of a glass material in the present invention.

Here, if the base sheet of the electrical conductivity sheet is made of a resin sheet, there is a problem of elongation of the film. Therefore, it is preferred to perform the patterning of the first resist layer 16 by simultaneous exposure on both sides of the electrical conductivity sheet. It is because if the patterning of the first resist layer 16 is performed by exposing one side at a time, the base sheet may cause elongation when the patterning of one side is finished and the electrical conductivity sheet is reattached to the exposure apparatus after the front and back sides of the same are flipped. Then, the elongation may cause a misregistration between the circuit pattern on the front side and the circuit pattern on the rear side. In the case of the example illustrated in FIG. 10, because the positional relationship between the rhombus electrodes 46 and the rhombus electrodes 47 are complementary, if there is misregistration between the circuit pattern on the front side and the circuit pattern on the rear side, it may not function correctly as the capacitance type touch sensor 20.

The light blocking conductive film 1 may be a layer made of a single metal film having high electrical conductivity and a good light blocking property, or a layer made of an alloy or a compound thereof, and can be formed by a vacuum deposition method, a sputtering method, an ion plating method, a plating method, or the like. Further, it is necessary to have an etchant that does not etch the transparent conductive film but etches the light blocking conductive film 1 itself. As an example of the preferred metal, there are aluminum, nickel, copper, silver, tin, and the like. In particular, a metal film made of copper foil having a thickness of 20 to 1,000 nm is further preferable because it has a good electrical conductivity and light blocking property, and because the transparent conductive film can be easily etched by hydrogen peroxide water in an non-etchable acid atmosphere, and because it is also easy to connect to the external circuit. More preferably, the thickness is 30 nm or larger. Still more preferably, the thickness is 100 to 500 nm. It is because a light blocking property metal film layer 1 having high electrical conductivity can be obtained by setting the thickness to 100 nm or larger, while a light blocking property metal film layer 1 that can be easily handled and has a good processability can be obtained by setting the thickness to 500 nm or smaller.

The transparent conductive film 3 may be a layer made of metal oxide such as indium tin oxide, zinc oxide, or the like, and can be formed by a vacuum deposition method, a sputtering method, an ion plating method, a plating method, or the like. The thickness is approximately a few tens to a few hundreds nanometers. It is necessary that the transparent conductive film 3 is easily etched in a solution of ferric chloride or the like together with the light blocking conductive film 1, but cannot be easily etched by the etching liquid of the light blocking conductive film 1 such as the hydrogen peroxide water in the acid atmosphere. Further, it is preferred that the transparent conductive film 3 has a light transmittance of 80% or higher and a surface resistance of a few milliohms to a few hundreds ohms. In addition, the transparent conductive film 3 may be made of an electrically conductive polymer film of thiophene or the like, or a conductive fiber film including metal nano wires or carbon nanotubes. In this case, the transparent conductive film 3 can be formed by various printing methods or painting methods.

The first resist layer 16 may be made of an acrylic photoresist material having a thickness of 10 to 20 μm that can be exposed by a high pressure mercury-vapor lamp, a super high pressure mercury-vapor lamp, a laser beam, or a metal halide lamp, and can be developed by alkali solution or the like. It is because the fine wiring circuit pattern 10 having a thin width can be reliably formed by exposure and development using the photoresist material and the narrow frame touch input sheet 5 having a thinner bezel can be manufactured. It is preferred to form the first resist layer 16 by a general printing method such as gravure printing, screen printing, or offset printing, various coating methods, a painting method, a dipping method, a dry film resist method, or other various methods, across the entire surface. After that, patterning is performed by exposure and development. Among the methods, the dry film resist method is more preferred.

A dry film resist (DFR) used in the dry film resist method is a film in which a photosensitive layer to be the first resist layer 16 is sandwiched between a base film and a cover film. The above-mentioned printing method, coating method, painting method, and the like have a problem that only one side may be coated, so that efficiency is low. In contrast, the dry film resist method has a high productivity and can support various requirements so as to go mainstream, because it is a method that involves gluing the photosensitive layer through a heating roll after removing the cover film. Note that the exposure is usually performed by placing the mask on the base film (not shown), and the development is performed after the base film is removed. The base film of the dry film resist may be made of polyethylene terephthalate or the like. In addition, the cover film of the dry film resist may be made of polyethylene or the like.

It is preferred that the second resist layer 18 is formed of the above-mentioned photoresist material with anticorrosion agent added. As the anticorrosion agent, a material that is known as the anticorrosion agent may be used. As specific examples, imidazole, triazole, benzotriazole, benzimidazole, benzothiazole, pyrazole, or the like can be used, for example. In addition, there are a monocyclic or polycyclic azole group such as halogen of these, alkyl or phenyl substituent, an aromatic amine group such as aniline, aliphatic amine such as alkyl amine, and a salt thereof. In addition, there is no need to limit the material particularly to the material described in this description. The method of forming the second resist layer 18 may be a general printing method such as a gravure printing method, a screen printing method, or an offset printing method. Other than those, there are various coating methods, the painting method, the dipping method, and the dry film resist method. The second resist layer 18 is formed by such a method on the entire surface, and then exposure and development are performed for patterning. Among the methods, the dry film resist method is more preferable. In addition, because it is not necessary to form a high precision pattern, it is possible to form the pattern directly with the printing method without using a photoprocess.

In addition, a design pattern layer may be formed on the second resist layer 18 so that the fine wiring circuit pattern 10 is hidden and a visual design is improved. The design pattern is preferably formed using coloring ink containing polyvinyl, polyamide, polyacrylic, polyurethane, or alkyd resin as binder and pigment or dye of appropriate color as coloring agent. In addition, it is possible to use metal grains of aluminum, titanium, bronze, or the like, or pearl pigment of mica coated with titanium oxide, or the like as the coloring agent. As a method of forming the design pattern, there are a general printing method such as a gravure printing method, a screen printing method, or an offset printing method, various coating methods, or a painting method.

The second embodiment of the manufacturing method of the narrow frame touch input sheet is described above, in which the electrode patterns and the fine wiring circuit patterns are formed on the front and back sides of the transparent base sheet made of the single resin sheet 7, but the present invention is not limited to this.

For instance, the electrode patterns and the fine wiring circuit patterns 10 of the transparent conductive film 3 can be formed on the uppermost and lower most surfaces of a transparent base sheet made of a laminated body of a plurality of resin sheets 7 and 7 (third embodiment; see FIG. 7) instead of the base sheet made of the single resin sheet 7 of the second embodiment.

Figure 8A:
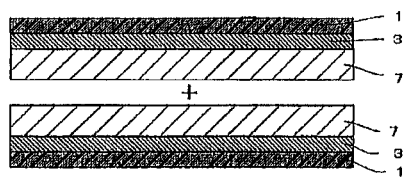
FIG. 8(a) is a schematic cross sectional view illustrating a process for manufacturing the narrow frame touch input sheet of FIG. 7.
Figure 8B:
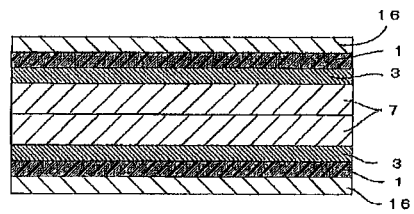
FIG. 8(b) is a schematic cross sectional view illustrating the process for manufacturing the narrow frame touch input sheet of FIG. 7.

In order to obtain the narrow frame touch input sheet of the third embodiment, first, using two thin resin sheets 7 and 7, the transparent conductive film 3 and the light blocking conductive film 1 are sequentially laminated in advance on one surface of each sheet, and the resin sheets 7 and 7 are laminated so as to face each other (see FIG. 8(a)). Then, the first resist layers 16 are formed on both sides (see FIG. 8(b)). Alternatively, prior to laminating the resin sheets 7 and 7, only the transparent conductive film 3 is formed in advance, and the resin sheets 7 and 7 are laminated to face each other. Then, the light blocking conductive films 1 and the first resist layers 16 are sequentially laminated on both sides. Alternatively, after laminating the resin sheets 7 and 7, the transparent conductive films 3, the light blocking conductive films 1, and the first resist layers 16 may be sequentially laminated on both sides. Note that, as laminating means of the resin sheets 7, there are thermal lamination and dry lamination using an adhesive layer. When using the adhesive layer for laminating the resin sheets 7, it is possible to use the adhesive layer having a core so that thickness of the entire laminated body can be adjusted. In addition, it is possible to dispose another resin sheet between the resin sheets 7 and 7 of the uppermost and lower most surfaces so that thickness of the entire laminated body can be adjusted.

Figure 8C:
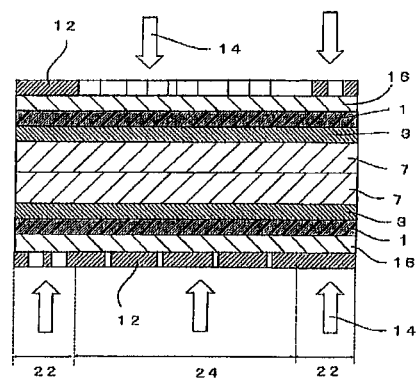
FIG. 8(c) is a schematic cross sectional view illustrating the process for manufacturing the narrow frame touch input sheet of FIG. 7.

The following steps are the same as those of the second embodiment. Specifically, the masks 12 of desired patterns are placed on the uppermost and lower most surfaces of a transparent base sheet made of the laminated body, exposure (see FIG. 8(c)) and development are performed so as to pattern the first resist layer 16.

Figure 8D:
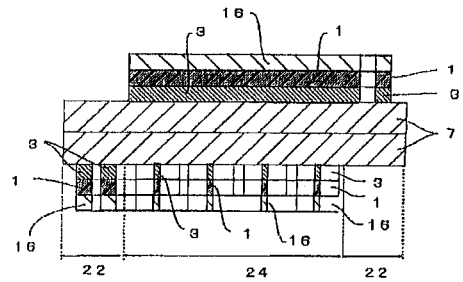
FIG. 8(d) is a schematic cross sectional view illustrating the process for manufacturing the narrow frame touch input sheet of FIG. 7.

Next, using the etching liquid such as ferric chloride, the transparent conductive film 3 and the light blocking conductive film 1 are simultaneously etched so that the transparent conductive film 3 and the light blocking conductive film 1 of the part on which the first resist layer 16 after patterning is not laminated are removed. Thus, the transparent conductive film 3 and the light blocking conductive film 1 are laminated without misregistration to form the electrode pattern 9 in the center window on both sides of the base sheet, and the transparent conductive film 3 and the light blocking conductive film 1 are laminated without misregistration to form the fine wiring circuit pattern 10 on the outer frame on both sides of the base sheet (see FIG. 8(d)).

Figure 8E:
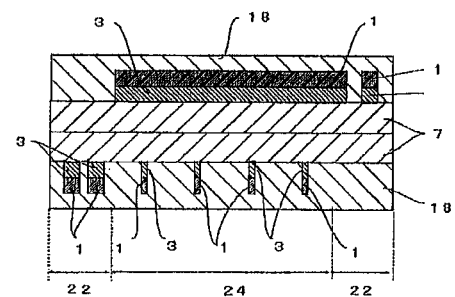
FIG. 8(e) is a schematic cross sectional view illustrating the process for manufacturing the narrow frame touch input sheet of FIG. 7.
Figure 8F:
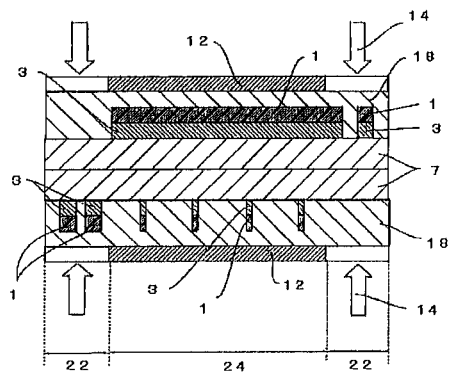
FIG. 8(f) is a schematic cross sectional view illustrating the process for manufacturing the narrow frame touch input sheet of FIG. 7.
Figure 8G:
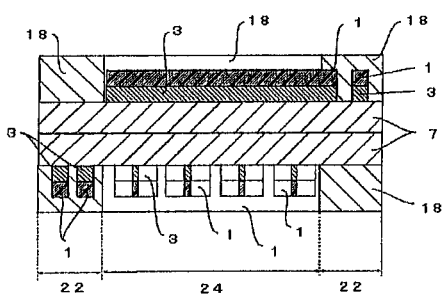
FIG. 8(g) is a schematic cross sectional view illustrating the process for manufacturing the narrow frame touch input sheet of FIG. 7.
Figure 9A:
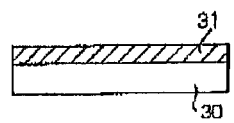
FIG. 9 is a diagram illustrating a process for forming electrodes of the touch input device described in Patent Literature 1.
Figure 9D:
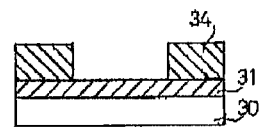
Figure 9B:
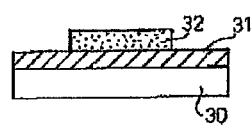
Figure 9E:
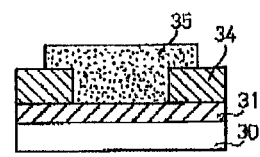
Figure 9C:
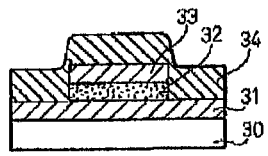
Figure 9F:
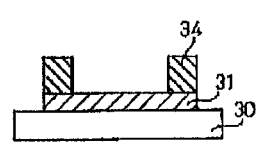

Next, using the resist release liquid, the first resist layer 16 is removed so that the light blocking conductive film 1 is revealed. Then, the second resist layer 18 with the anticorrosion agent added is formed on the entire surface of the revealed light blocking conductive film 1 (see FIG. 8(e)). After that, the masks 12 are placed on the second resist layer 18, and exposure (see FIG. 8(f)) and development are performed so as to pattern the second resist layer 18 (see FIG. 8(g)).

Figure 7:
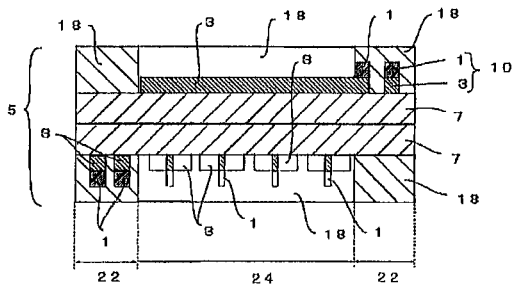
FIG. 7 is a schematic cross sectional view illustrating an example of the narrow frame touch input sheet in which the electrode patterns and the fine wiring circuit patterns are formed on uppermost and lower most surfaces of a transparent base sheet made of a laminated body of two resin sheets.

Next, etching with the special etching liquid such as acidified hydrogen peroxide is performed so that the light blocking conductive film 1 is removed only in the part where the second resist layer 18 after patterning is not laminated. Thus, the transparent conductive film 3 is revealed in the terminal portions 25 of the center window 24 and the outer frame 22 on both sides of the base sheet, and the second resist layer 18 is not removed but is remained as the anticorrosion layer. Thus, the narrow frame touch input sheet is obtained, including the base sheet that is the laminated body of two resin sheets as illustrated in FIG. 7.

Fourth Embodiment

Figure 11:
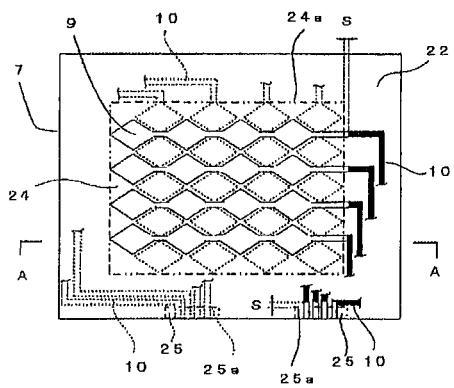
FIG. 11 is a diagram illustrating the electrode patterns and the fine wiring circuit patterns of an example of the narrow frame touch input sheet according to the present invention.
Figure 12:
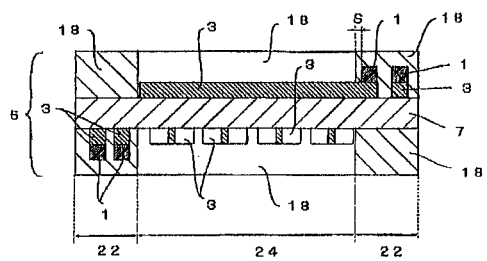
FIG. 12 is a schematic cross sectional view of an example of the narrow frame touch input sheet in which the electrode patterns and the fine wiring circuit patterns are formed on both sides of a transparent base sheet made of a resin sheet.
Figure 13A:
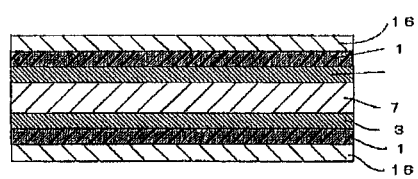
FIG. 13(a) is a schematic cross sectional view illustrating a process for manufacturing the narrow frame touch input sheet of FIG. 12.
Figure 13B:
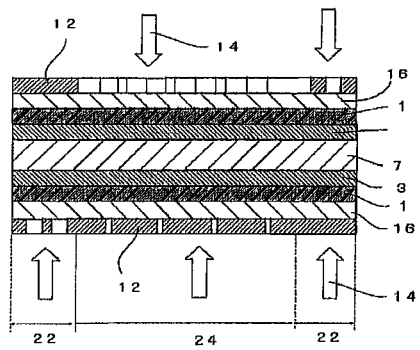
FIG. 13(b) is a schematic cross sectional view illustrating the process for manufacturing the narrow frame touch input sheet of FIG. 12.
Figure 13C:
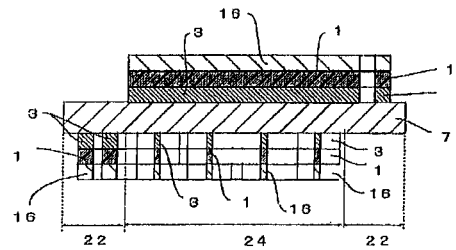
FIG. 13(c) is a schematic cross sectional view illustrating the process for manufacturing the narrow frame touch input sheet of FIG. 12.
Figure 13D:
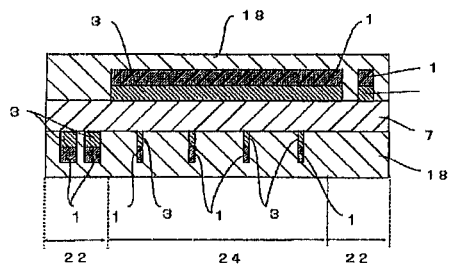
FIG. 13(d) is a schematic cross sectional view illustrating the process for manufacturing the narrow frame touch input sheet of FIG. 12.
Figure 13E:
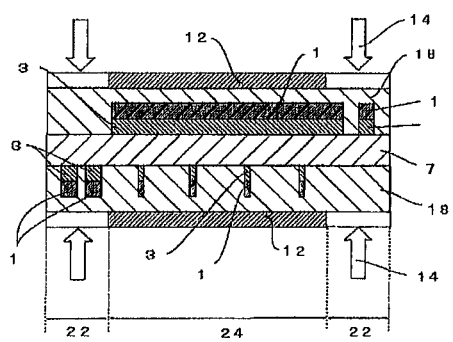
FIG. 13(e) is a schematic cross sectional view illustrating the process for manufacturing the narrow frame touch input sheet of FIG. 12.
Figure 13F:
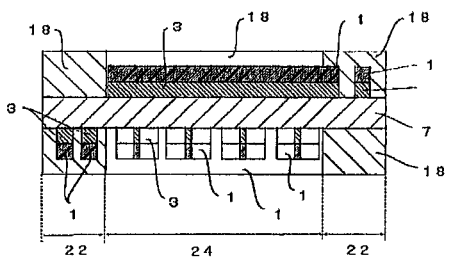
FIG. 13(f) is a schematic cross sectional view illustrating the process for manufacturing the narrow frame touch input sheet of FIG. 12.
Figure 13G:
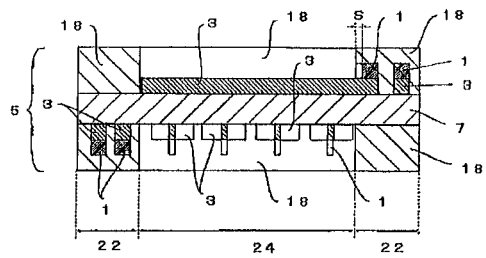
FIG. 13(g) is a schematic cross sectional view illustrating the process for manufacturing the narrow frame touch input sheet of FIG. 12.

Hereinafter, with reference to the drawings, a fourth embodiment of the present invention is described in detail. FIG. 11 is a diagram illustrating the electrode patterns and the fine wiring circuit patterns of an example of the narrow frame touch input sheet according to the present invention. FIG. 12 is a schematic cross sectional view illustrating an example of the narrow frame touch input sheet in which the electrode patterns and the fine wiring circuit patterns are formed on both sides of a transparent base sheet made of a resin sheet (taken along line AA illustrated in FIG. 11; the number of fine wiring circuit patterns is reduced). FIGS. 13(a) to 13(g) are schematic cross sectional views illustrating a manufacturing process thereof. In the figures, numeral 1 denotes a light blocking conductive film layer, numeral 3 denotes a transparent conductive film, numeral 5 denotes a narrow frame touch input sheet, numeral 7 denotes a resin sheet, numeral 9 denotes an electrode pattern, numeral 10 denotes a fine wiring circuit pattern, numeral 12 denotes a mask, numeral 14 denotes exposing light rays, numeral 16 denotes a first resist layer, numeral 18 denotes a second resist layer (and anticorrosion layer), numeral 20 denotes a capacitance type touch sensor, numeral 22 denotes the outer frame of the narrow frame touch input sheet 5, numeral 24 denotes the center window of the narrow frame touch input sheet 5, and S denotes a side etched portion.

The narrow frame touch input sheet 5 obtained by the present invention includes the base sheet having the center windows 24 on both sides, the electrode patterns 9 made of only the transparent conductive film 3 formed in the center windows 24, the outer frame 22 on which the transparent conductive film 3 and the light blocking conductive film 1 are laminated, in order, so as to form the fine wiring circuit pattern 10 (see FIG. 11). The transparent conductive film 3 and the light blocking conductive film 1 of the fine wiring circuit pattern 10 are laminated in the same pattern without misregistration, except at boundaries with the center window and with the terminal portion. Further, the transparent base sheet on which the electrode pattern 9 and the fine wiring circuit pattern 10 are formed can be made of a single resin sheet 7 (see FIG. 12).

A manufacturing method of the narrow frame touch input sheet 5, in which the electrode patterns 9 and the fine wiring circuit patterns 10 of the transparent conductive film 3 are formed on both sides, includes the following steps. First, the transparent conductive film 3, the light blocking conductive film 1, and the first resist layer 16 are formed, in order, on the entire surface on both the front and back sides of the transparent base sheet made of one resin sheet 7 so as to obtain an electrical conductivity sheet (see FIG. 13(a)). Then, the masks 12 having desired patterns are placed on the front and back sides, and exposure (see FIG. 13(b)) and development are performed so as to pattern the first resist layer 16. In this case, the light blocking conductive film 1 blocks the exposing light rays 14 from the opposite side. Therefore, even if the exposure is performed simultaneously on both sides with different mask patterns, the exposure on one side does not affect the pattern of the first resist layer 16 on the opposite side. Therefore, because both sides can be exposed simultaneously, registration of the first resist layers 16 on the front and back sides can be performed easily, and patterning of both sides can be performed in one step so that productivity can be improved. Note that the position of the mask 12 illustrated in FIG. 13(b) indicates a case where the first resist layer 16 is a negative type (when it is exposed, its solubility is decreased with respect to developing solution so that an exposed part remains after development). If a positive type (when it is exposed, its solubility is increased with respect to the developing solution so that the exposed part is removed) is used, the parts shielded from light by the mask would be opposite.

Note that alignment between the front mask and the rear mask can be performed by using a known mask alignment method of a double-side exposing apparatus. For instance, an alignment method between the front mask and the rear mask is as follows. Mask alignment marks are formed on the front mask and the rear mask, and an optical reading sensor such as a camera reads an overlaid state of the pair of mask alignment marks so as to obtain relative positional information between the front mask and the rear mask. Then, based on the obtained positional information, a mask position adjustment mechanism moves the front mask and the rear mask relatively to each other so that the pair of mask alignment marks are overlaid correctly.

Next, using the etching liquid such as ferric chloride, the transparent conductive film 3 and the light blocking conductive film 1 are simultaneously etched so that the transparent conductive film 3 and the light blocking conductive film 1 of the part on which the first resist layer 16 after patterning is not laminated are removed. Thus, the transparent conductive film 3 and the light blocking conductive film 1 are laminated without misregistration to form the electrode pattern 9 in the center window on both sides of the base sheet, and the transparent conductive film 3 and the light blocking conductive film 1 are laminated without misregistration to form the fine wiring circuit pattern 10 on the outer frame on both sides of the base sheet (see FIG. 13(c)).

Next, using the resist release liquid, the first resist layer 16 is removed so that the light blocking conductive film 1 is revealed. Then, the second resist layer 18 with the anticorrosion agent added is formed on the entire surface of the revealed light blocking conductive film 1 (see FIG. 13(d)). After that, the masks 12 are placed on the second resist layer 18, and exposure (see FIG. 13(e)) and development are performed so as to pattern the second resist layer 18 (see FIG. 13(f)). Note that the position of the mask 12 illustrated in FIG. 13(e) indicates a case where the second resist layer 18 is a negative type (when it is exposed, its solubility is decreased with respect to developing solution so that an exposed part remains after development).

Next, etching with the special etching liquid such as acidified hydrogen peroxide is performed so that the light blocking conductive film 1 is removed only in the part where the second resist layer 18 after patterning is not laminated. Thus, the transparent conductive film 3 is revealed in the terminal portions 25 of the center window 24 and the outer frame 22 on both sides of the base sheet and, further, side etching of the revealed end face of the light blocking conductive film 1 is performed slightly at the boundaries 24a and 25a with the center window 24 and with the terminal portion 25 (S in the diagram), so that the second resist layer 18 has a visor structure (see FIG. 13(g)). The side etching amount of approximately 2 µm, for example, is sufficient.

Finally, the second resist layer 18 of the visor structure is softened by heat treatment so as to cover the revealed end face of the remaining light blocking conductive film 1, and in this state, the second resist layer 18 is not removed but is remained as the anticorrosion layer (see FIG. 12). Because the second resist layer 18 functions as the anticorrosion layer, and because the end face of the light blocking conductive film is not revealed at the boundaries with the center window and with the terminal portion, even if corrosive liquid enters from the outside after the product is completed, or even under a test environment such as high temperature and high humidity, anticorrosion property of the wiring circuit is very high so that electric characteristics can be maintained. Note that in FIG. 11, the fine wiring circuit pattern 10 formed on the surface of the base sheet (resin sheet 7) is shown in black color in the part where the light blocking conductive film 1 is laminated, and is shown in white color in the part where the transparent conductive film 3 is revealed. Both ends of the black color part are set back by S from the boundary 24a with the center window 24 and from the boundary 25a with the terminal portion 25.

Note that if the transparent conductive film 3 is an amorphous material, it is preferred to crystallize the transparent conductive film 3 by a method of heat treatment or the like before the etching. It is because etching resistance is improved by the crystallization so that only the light blocking property metal film 1 may be selectively etched more easily.

End portions of the fine wiring circuit patterns 10 formed on both sides of the narrow frame touch input sheet 5 obtained by the method described above are connected, at the terminal portions 25, to the external circuit 28 on which the IC chips are mounted. Thus, a capacitance type touch sensor 20 is manufactured, in which the transparent conductive film 3 are formed on both sides of the base sheet.

Next, the individual layers forming the narrow frame touch input sheet 5 are described in detail.

First, the base sheet is usually made of a transparent sheet having a thickness of approximately 30 to 2,000 µm, and its material may be the resin sheet 7 of polyester resin, polystyrene resin, olefin resin, polybutylene terephthalate resin, polycarbonate resin, acrylic resin, or the like. Note that in the present invention, the base sheet may be made of a glass material.

Here, if the base sheet of the electrical conductivity sheet is made of a resin sheet, there is a problem of elongation of the film. Therefore, it is preferred to perform the patterning of the first resist layer 16 by simultaneous exposure on both sides of the electrical conductivity sheet. It is because if the patterning of the first resist layer 16 is performed by exposing one side at a time, the base sheet may cause elongation when the patterning of one side is finished and the electrical conductivity sheet is reattached to the exposure apparatus after the front and back sides of the same are flipped. Then, the elongation may cause a misregistration between the circuit pattern on the front side and the circuit pattern on the rear side. In the case of the example illustrated in FIG. 7, because the positional relationship between the rhombus electrodes 46 and the rhombus electrodes 47 are complementary, if there is misregistration between the circuit pattern on the front side and the circuit pattern on the rear side, it may not function correctly as the capacitance type touch sensor 20.

The light blocking conductive film 1 may be a layer made of a single metal film having high electrical conductivity and a good light blocking property, or a layer made of an alloy or a compound thereof, and can be formed by a vacuum deposition method, a sputtering method, an ion plating method, a plating method, or the like. Further, it is necessary to have an etchant that does not etch the transparent conductive film but etches the light blocking conductive film 1 itself. As an example of the preferred metal, there are aluminum, nickel, copper, silver, tin, and the like. In particular, a metal film made of copper foil having a thickness of 20 to 1,000 nm is further preferable because it has a good electrical conductivity and light blocking property, and because the transparent conductive film can be easily etched by hydrogen peroxide water in an non-etchable acid atmosphere, and because it is also easy to connect to the external circuit. More preferably, the thickness is 30 nm or larger. Still more preferably, the thickness is 100 to 500 nm. It is because a light blocking property metal film layer 1 having high electrical conductivity can be obtained by setting the thickness to 100 nm or larger, while a light blocking property metal film layer 1 that can be easily handled and has a good processability can be obtained by setting the thickness to 500 nm or smaller.

The transparent conductive film 3 may be a layer made of metal oxide such as indium tin oxide, zinc oxide, and the like, and can be formed by a vacuum deposition method, a sputtering method, an ion plating method, a plating method, or the like. The thickness is approximately a few tens to a few hundreds nanometers. It is necessary that the transparent conductive film 3 is easily etched in a solution of ferric chloride or the like together with the light blocking conductive film 1, but cannot be easily etched by the etching liquid of the light blocking conductive film 1 such as the hydrogen peroxide water in the acid atmosphere. Further, it is preferred that the transparent conductive film 3 has a light transmittance of 80% or higher and a surface resistance of a few milliohms to a few hundreds ohms. In addition, the transparent conductive film 3 may be made of an electrically conductive polymer film of thiophene or the like, or a conductive fiber film including metal nano wires or carbon nanotubes. In this case, the transparent conductive film 3 can be formed by various printing methods or painting methods.

The first resist layer 16 may be made of an acrylic photoresist material having a thickness of 10 to 20 μm that can be exposed by a high pressure mercury-vapor lamp, a super high pressure mercury-vapor lamp, a laser beam, or a metal halide lamp, and can be developed by alkali solution or the like. It is because the fine wiring circuit pattern 10 having a thin width can be reliably formed by exposure and development using the photoresist material and the narrow frame touch input sheet 5 having a thinner bezel can be manufactured. It is preferred to form the first resist layer 16 by a general printing method such as gravure printing, screen printing, or offset printing, various coating methods, a painting method, a dipping method, a dry film resist method, or other various methods, across the entire surface. After that, exposure and development are performed for patterning. Among the methods, the dry film resist method is more preferred.

A dry film resist (DFR) used in the dry film resist method is a film in which a photosensitive layer to be the first resist layer 16 is sandwiched between a base film and a cover film. The above-mentioned printing method, coating method, painting method, and the like have a problem that only one side may be coated, so that efficiency is low. In contrast, the dry film resist method has a high productivity and can support various requirements so as to go mainstream, because it is a method that involves gluing the photosensitive layer through a heating roll after removing the cover film. Note that the exposure is usually performed by placing the mask on the base film (not shown), and the development is performed after the base film is removed. The base film of the dry film resist may be made of polyethylene terephthalate or the like. In addition, the cover film of the dry film resist may be made of polyethylene or the like.

It is preferred to form the second resist layer 18 with the same material as the first resist layer 16, containing photoresist material having a thickness of 2.5 to 10 μm, more preferably 2.5 to 5 μm, and with an anticorrosion agent added. As the anticorrosion agent, a material that is known as the anticorrosion agent may be used. As specific examples, imidazole, triazole, benzotriazole, benzimidazole, benzothiazole, pyrazole, or the like can be used, for example. In addition, there are a monocyclic or polycyclic azole group such as halogen of these, alkyl or phenyl substituent, an aromatic amine group such as aniline, aliphatic amine such as alkyl amine, and a salt thereof. In addition, there is no need to limit the material particularly to the material described in this description. The method of forming the second resist layer 18 may be a general printing method such as the gravure printing, the screen printing, and the offset printing. Other than those, there are various coating methods, the painting method, the dipping method, and the dry film resist method. The second resist layer 18 is formed by such a method on the entire surface, and then exposure and development are performed for patterning. Among the methods, the dry film resist method is more preferable. In addition, because it is not necessary to form a high precision pattern, it is possible to form the pattern directly with the printing method without using a photoprocess.

In addition, a design pattern layer may be formed on the second resist layer 18 so that the fine wiring circuit pattern 10 is hidden and a visual design is improved. The design pattern is preferably formed using coloring ink containing polyvinyl, polyamide, polyacrylic, polyurethane, or alkyd resin as binder and pigment or dye of appropriate color as coloring agent. In addition, it is possible to use metal grains of aluminum, titanium, bronze, or the like, or pearl pigment of mica coated with titanium oxide, or the like as the coloring agent. As a method of forming the design pattern, there are a general printing method such as a gravure printing method, a screen printing method, or an offset printing method, various coating methods, or a painting method.

The fourth embodiment of the manufacturing method of the narrow frame touch input sheet is described above, in which the electrode patterns and the fine wiring circuit patterns are formed on the front and back sides of the transparent base sheet made of the single resin sheet 7, but the present invention is not limited to this.

For instance, the electrode patterns 9 and the fine wiring circuit patterns 10 of the transparent conductive film 3 may be formed on the uppermost and lower most surfaces of a transparent base sheet made of a laminated body of a plurality of resin sheets 7 and 7 (fifth embodiment; see FIG. 14) instead of the base sheet made of the single resin sheet 7 of the fourth embodiment.

In order to obtain the narrow frame touch input sheet of the fifth embodiment, first, two thin resin sheets 7 and 7 are used for sequentially laminating the transparent conductive film 3 and the light blocking conductive film 1 on one side of each sheet in advance. Then, the resin sheets 7 and 7 are laminated to face each other (see FIG. 15(*a*)). After that, the first resist layers 16 are formed on both sides (see FIG. 15(*b*)). Alternatively, prior to laminating the resin sheets 7 and 7, only the transparent conductive film 3 is formed in advance, and the resin sheets 7 and 7 are laminated to face each other. Then, the light blocking conductive films 1 and the first resist layers 16 are sequentially laminated on both sides. Alternatively, after laminating the resin sheets 7 and 7, the transparent conductive films 3, the light blocking conductive films 1, and the first resist layers 16 may be sequentially laminated on both sides. Note that, as laminating means of the resin sheets 7, there are thermal lamination and dry lamination using an adhesive layer. When using the adhesive layer for laminating the resin sheets 7, it is possible to use the adhesive layer having a core so that thickness of the entire laminated body can be adjusted.

In addition, it is possible to dispose another resin sheet between the resin sheets 7 and 7 of the uppermost and lower most surfaces so that thickness of the entire laminated body can be adjusted.

The following steps are the same as those of the fourth embodiment. Specifically, the masks 12 of desired patterns are placed on the uppermost and lower most surfaces of a transparent base sheet made of the laminated body, exposure (see FIG. 15(c)) and development are performed so as to pattern the first resist layer 16.

Next, using the etching liquid such as ferric chloride, the transparent conductive film 3 and the light blocking conductive film 1 are simultaneously etched so that the transparent conductive film 3 and the light blocking conductive film 1 of the part on which the first resist layer 16 after patterning is not laminated are removed. Thus, the transparent conductive film 3 and the light blocking conductive film 1 are laminated without misregistration to form the electrode pattern 9 in the center window on both sides of the base sheet, and the transparent conductive film 3 and the light blocking conductive film 1 are laminated without misregistration to form the fine wiring circuit pattern 10 on the outer frame on both sides of the base sheet (see FIG. 15(d)).

Next, using the resist release liquid, the first resist layer 16 is removed so that the light blocking conductive film 1 is revealed. Then, the second resist layer 18 with the anticorrosion agent added is formed on the entire surface of the revealed light blocking conductive film 1 (see FIG. 15(e)). After that, the masks 12 are placed on the second resist layer 18, and exposure (see FIG. 15(f)) and development are performed so as to pattern the second resist layer 18 (see FIG. 15(g)).

Next, etching with the special etching liquid such as acidified hydrogen peroxide is performed so that the light blocking conductive film 1 is removed only in the part where the second resist layer 18 after patterning is not laminated. Thus, the transparent conductive film 3 is revealed in the terminal portions 25 of the center window 24 and the outer frame 22 on both sides of the base sheet and, further, side etching of the revealed end face of the light blocking conductive film 1 is performed at the boundaries 24a and 25a with the center window 24 and with the terminal portion 25 (S in the diagram), so that the second resist layer 18 has a visor structure (see FIG. 15(h)).

Figure 14:
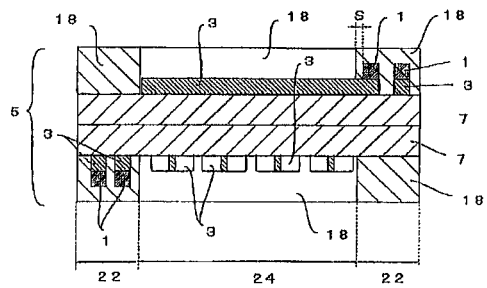
FIG. 14 is a schematic cross sectional view illustrating an example of the narrow frame touch input sheet in which the electrode patterns and the fine wiring circuit patterns are formed on uppermost and lower most surfaces of a transparent base sheet made of a laminated body of two resin sheets.
Figure 15A:
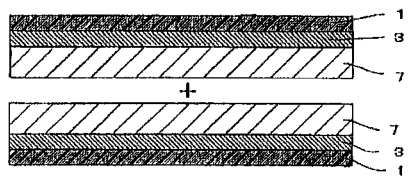
FIG. 15(a) is a schematic cross sectional view illustrating a process for manufacturing the narrow frame touch input sheet of FIG. 14.
Figure 15B:
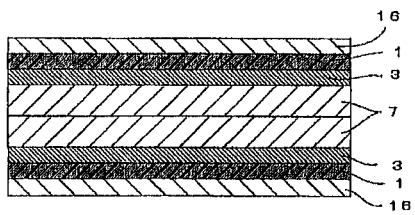
FIG. 15(b) is a schematic cross sectional view illustrating the process for manufacturing the narrow frame touch input sheet of FIG. 14.
Figure 15C:
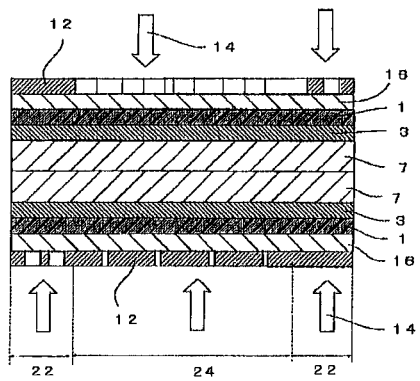
FIG. 15(c) is a schematic cross sectional view illustrating the process for manufacturing the narrow frame touch input sheet of FIG. 14.
Figure 15D:
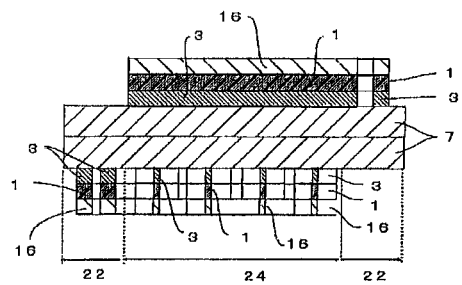
FIG. 15(d) is a schematic cross sectional view illustrating the process for manufacturing the narrow frame touch input sheet of FIG. 14.
Figure 15E:
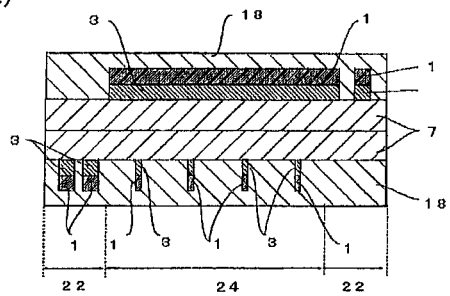
FIG. 15(e) is a schematic cross sectional view illustrating the process for manufacturing the narrow frame touch input sheet of FIG. 14.
Figure 15F:
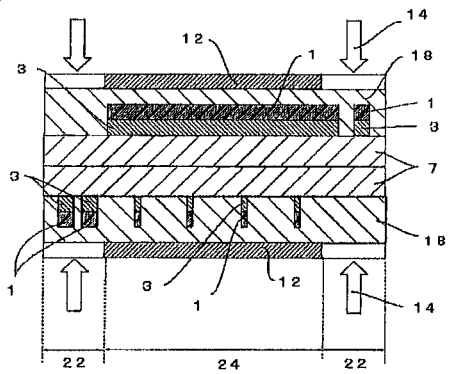
FIG. 15(f) is a schematic cross sectional view illustrating the process for manufacturing the narrow frame touch input sheet of FIG. 14.
Figure 15G:
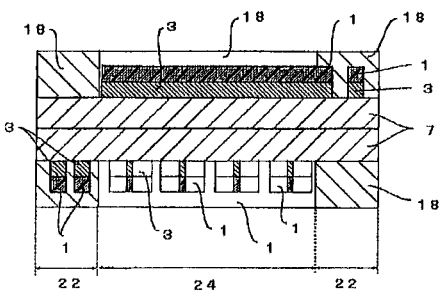
FIG. 15(g) is a schematic cross sectional view illustrating the process for manufacturing the narrow frame touch input sheet of FIG. 14.
Figure 15H:
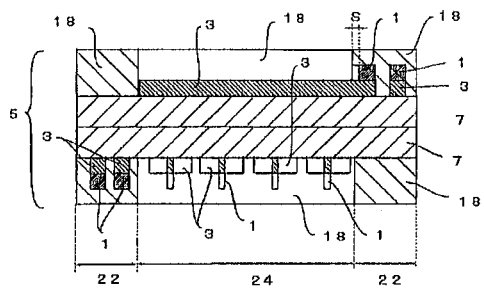
FIG. 15(h) is a schematic cross sectional view illustrating the process for manufacturing the narrow frame touch input sheet of FIG. 14.

Finally, the second resist layer 18 of the visor structure is softened by heat treatment so as to cover the revealed end face of the remaining light blocking conductive film 1, and in this state, the second resist layer 18 is not removed but is remained as the anticorrosion layer. Thus, the narrow frame touch input sheet is obtained, including the base sheet that is the laminated body of two resin sheets as illustrated in FIG. 14.

Sixth Embodiment

Figure 16:
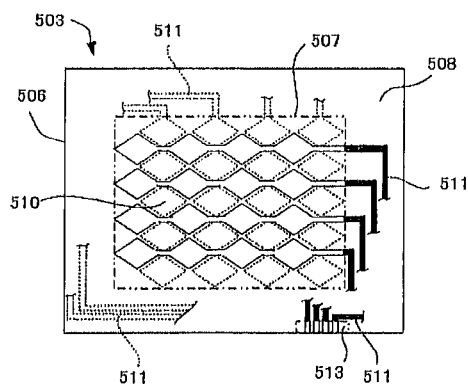
FIG. 16 is a diagram illustrating the electrode patterns and the fine wiring circuit patterns of an example of the touch input sheet according to the present invention.
Figure 17:
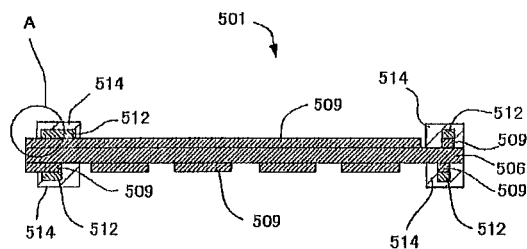
FIG. 17 is a cross sectional view illustrating an example of the touch input sheet in which the electrode patterns and the fine wiring circuit patterns are formed on both sides of a transparent base sheet made of a resin sheet.
Figure 18:
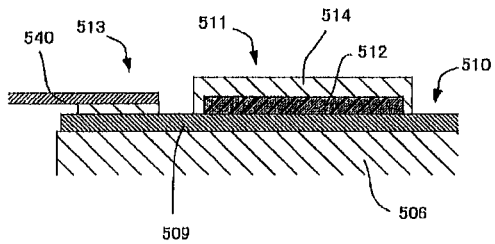
FIG. 18 is a partial enlarged cross sectional view illustrating a terminal portion of the touch input sheet of FIG. 17 and its vicinity A.
Figure 19A:
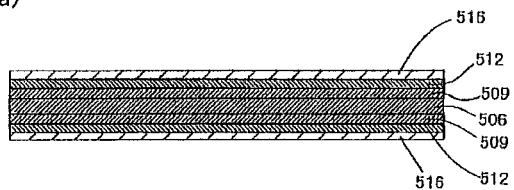
FIG. 19(a) is a cross sectional view illustrating a process for manufacturing the touch input sheet of FIG. 17.
Figure 19B:
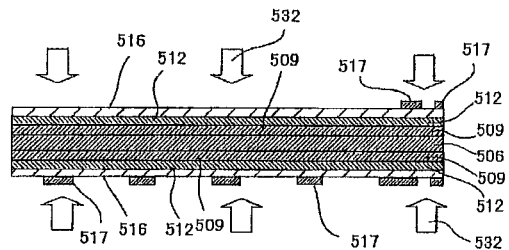
FIG. 19(b) is a cross sectional view illustrating the process for manufacturing the touch input sheet of FIG. 17.
Figure 19C:
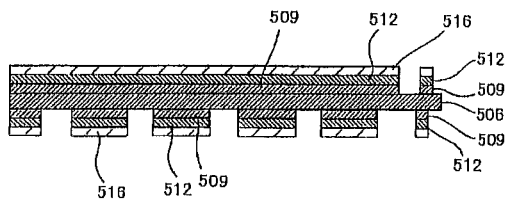
FIG. 19(c) is a cross sectional view illustrating the process for manufacturing the touch input sheet of FIG. 17.
Figure 19D:
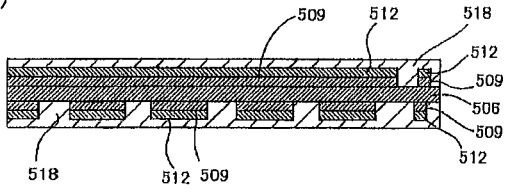
FIG. 19(d) is a cross sectional view illustrating the process for manufacturing the touch input sheet of FIG. 17.
Figure 19E:
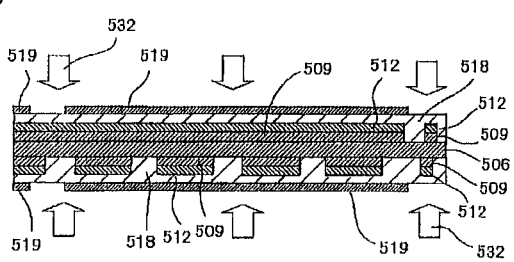
FIG. 19(e) is a cross sectional view illustrating the process for manufacturing the touch input sheet of FIG. 17.
Figure 19F:
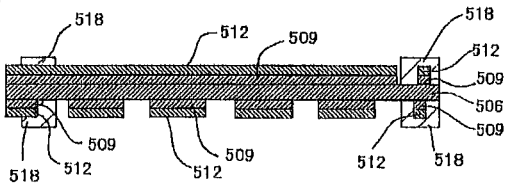
FIG. 19(f) is a cross sectional view illustrating the process for manufacturing the touch input sheet of FIG. 17.
Figure 19G:
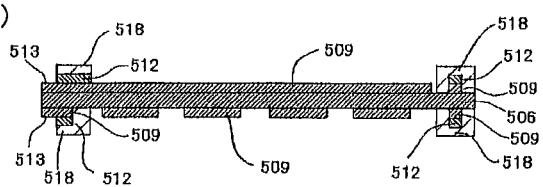
FIG. 19(g) is a cross sectional view illustrating the process for manufacturing the touch input sheet of FIG. 17.
Figure 19H:
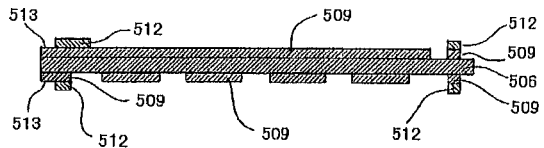
FIG. 19(h) is a cross sectional view illustrating the process for manufacturing the touch input sheet of FIG. 17.
Figure 19I:
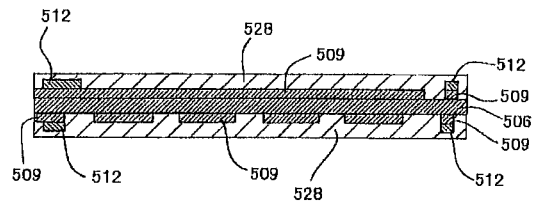
FIG. 19(i) is a cross sectional view illustrating the process for manufacturing the touch input sheet of FIG. 17.
Figure 19J:
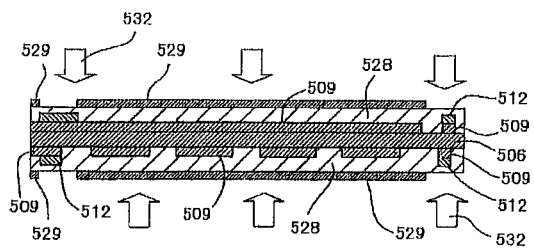
FIG. 19(j) is a cross sectional view illustrating the process for manufacturing the touch input sheet of FIG. 17.
Figure 19K:
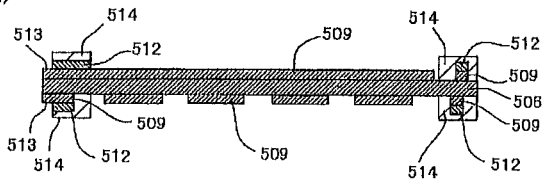
FIG. 19(k) is a cross sectional view illustrating the process for manufacturing the touch input sheet of FIG. 17.

Hereinafter, with reference to the drawings, the present invention is described in detail. FIG. 16 is a diagram illustrating the electrode patterns and the fine wiring circuit patterns of an example of the touch input sheet according to the present invention. FIG. 17 is a cross sectional view illustrating an example of the touch input sheet including the electrode patterns and the fine wiring circuit patterns formed on both sides of a transparent base sheet made of a resin sheet. FIG. 18 is a partial enlarged cross sectional view of a terminal portion of the touch input sheet of FIG. 17 and its vicinity A. FIGS. 19(a) to 19(k) are cross sectional views illustrating a process for manufacturing the touch input sheet of FIG. 17. In the figures, numeral 501 denotes a touch input sheet, numeral 506 denotes a resin sheet, numeral 507 denotes a center window, numeral 508 denotes an outer frame, numeral 509 denotes a transparent conductive film, numeral 510 denotes an electrode pattern, numeral 511 denotes a fine wiring circuit pattern, numeral 512 denotes a light blocking conductive film, numeral 513 denotes a terminal portion, numeral 514 denotes an anticorrosion functional film, numeral 516 denotes a first photoresist layer, numeral 517 denotes a mask, numeral 518 denotes a second photoresist layer, numeral 519 denotes a mask, numeral 528 denotes a third photoresist layer, numeral 529 denotes a mask, and numeral 532 denotes an exposing light rays.

The touch input sheet 501 illustrated in FIGS. 16 and 17 is a touch input sheet in which the electrode patterns 510 constituted of only the transparent conductive film 509 are formed in the center windows 507 on both sides of the base sheet, and the transparent conductive film 509 and the light blocking conductive film 512 are sequentially laminated so as to form the fine wiring circuit pattern 511 on the outer frame 508. The transparent conductive films 509 and the light blocking conductive films 512 of the fine wiring circuit patterns 511 are laminated to have the same width pattern without misregistration.

A manufacturing method of the touch input sheet 501, in which the electrode patterns 510 and the fine wiring circuit patterns 511 of the transparent conductive films 509 are formed on both sides, is as follows. First, on the entire surface of each side of the transparent base sheet constituted of the single resin sheet 506, the transparent conductive film 509, the light blocking conductive film 512, and the first photoresist layer 516 are sequentially laminated so that the conductive film is obtained (see FIG. 19(a)). Then masks 517 of desired patterns are placed on the front and back sides, and exposure (see FIG. 19(b)) and development are performed so that the first photoresist layers 516 are patterned. In this case, because the light blocking conductive film 1 blocks the exposing light rays 532 from the opposite side, even if the exposure is performed simultaneously on both sides with different mask patterns, exposure on one side does not affect patterns of the first photoresist layer 516 on the opposite side. Therefore, because the exposure can be performed on both sides simultaneously, the first photoresist layers 516 on the front and back sides can be aligned easily, and both sides can be patterned in one step, so that productivity can be improved. Note that the position of the mask 517 illustrated in FIG. 19(b) indicates a case where the first photoresist layer 516 is the negative type (when it is exposed, its solubility is decreased with respect to developing solution so that an exposed part remains after development). If a positive type (when it is exposed, its solubility is increased with respect to the developing solution so that the exposed part is removed) is used, the parts shielded from light by the mask would be opposite.

Next, using etching liquid such as ferric chloride, the transparent conductive film 509 and the light blocking conductive film 512 are simultaneously etched so that the transparent conductive film 509 and the light blocking conductive film 512 in the part where the patterned first photoresist layer 516 is not laminated are removed. Thus, in the center window 507 on each side of the resin sheet 506, the transparent conductive film 509 and the light blocking conductive film 512 are laminated without misregistration so as to form the electrode pattern 510. In addition, in the outer frame 508 on each side of the base sheet, the transparent conductive film 509 and the light blocking conductive film 512 are laminated without misregistration to form the fine wiring circuit pattern 511 (see FIG. 19(c)).

Here, the resin sheet 506 may have a problem of elongation. Therefore, it is preferred to perform the exposure simultaneously on both sides of the conductive film 6 for patterning the first photoresist layers 516. It is because if the patterning of the first photoresist layer 516 is performed by exposing one side at a time, the base sheet may cause elongation when the patterning of one side is finished and the electrical conductivity sheet is reattached to the exposure apparatus after the front and back sides of the same are flipped. Then, the elongation may cause a misregistration between the circuit pattern on the front side and the circuit pattern on the back side. In the case of the example illustrated in FIGS. 19 and 5, because the positional relationship between the rhombus electrodes 46 and the rhombus electrodes 47 are complementary, if there is misregistration between the circuit pattern on the front side and the circuit pattern on the rear side, it may not function correctly as the capacitance type touch sensor.

In the present invention, when the exposure is performed, the light blocking conductive film 512 blocks the exposing light rays 532 from the opposite side. Therefore, even if the exposure is performed simultaneously on both sides with different mask patterns, the exposure on one side does not affect the pattern of the first photoresist layer 516 on the opposite side. Therefore, because both sides can be exposed simultaneously, registration of the first resist layers 516 on the front and back sides can be performed easily, and patterning of both sides can be performed in one step so that productivity can be improved.

Note that alignment between the front mask and the rear mask can be performed by using a known mask alignment method of a double-side exposing apparatus. For instance, an alignment method between the front mask and the rear mask is as follows. Mask alignment marks are formed on the front mask and the rear mask, and an optical reading sensor such as a camera reads an overlaid state of the pair of mask alignment marks so as to obtain relative positional information between the front mask and the rear mask. Then, based on the obtained positional information, a mask position adjustment mechanism moves the front mask and the rear mask relatively to each other so that the pair of mask alignment marks are overlaid correctly.

After the above-mentioned etching, the first photoresist layer 516 is removed by resist release liquid, and the second photoresist layer 518 is formed on the entire surface on which the electrode pattern 510 and the fine wiring circuit pattern 511 are formed (see FIG. 19(*d*)). Then, the mask 519 is placed, and exposure (see FIG. 19(*e*)) and development are performed so as to pattern the second photoresist layer 518 (see FIG. 19(*f*)). Note that the position of the mask 519 illustrated in FIG. 19(*e*) indicates a case where the second photoresist layer 518 is a negative type (when it is exposed, its solubility is decreased with respect to developing solution so that an exposed part remains after development).

Next, etching is performed with special etching liquid such as acidified hydrogen peroxide, and the light blocking conductive film 512 is removed only in a part where t patterned second photoresist layer 518 is not laminated. Thus, the transparent conductive film 509 is revealed in the terminal portion 513 of the outer frame 508 and the center window 507 on each side of the base sheet (see FIG. 19(*g*)).

Note that if the transparent conductive film 509 is an amorphous material, it is preferred to crystallize the transparent conductive film 509 by a method of heat treatment or the like before the etching. It is because etching resistance is improved by the crystallization so that only the light blocking property metal film 512 may be selectively etched more easily.

Next, the second photoresist layer 518 is removed by the resist release liquid, and the light blocking conductive film 512 is revealed (see FIG. 19(*h*)). Then, the anticorrosion functional film 514 is formed to cover the revealed light blocking conductive film 512 (see FIG. 19(*k*)). Therefore, the fine wiring circuit pattern 511 can maintain a low resistance for a long period because the two-layer structure of the transparent conductive film 509 and the light blocking conductive film 512 is covered with the anticorrosion functional film 514, except for the terminal portion 513. In addition, the terminal portion 513 can maintain electrical connection to an FPC 540 because the light blocking conductive film 512 is removed in the terminal portion 513.

Figure 20:
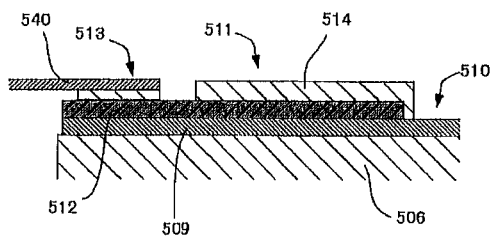
FIG. 20 is a partial enlarged cross sectional view illustrating an example of the terminal portion in which a light blocking conductive film is exposed.
Figure 21:
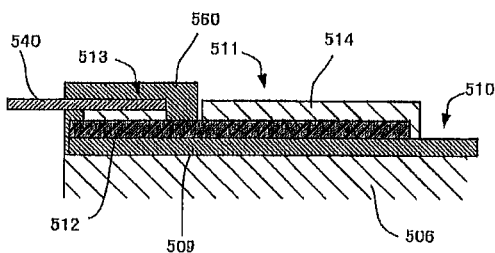
FIG. 21 is a partial enlarged cross sectional view illustrating an example in which conformal coat is applied to a connection portion with an FPC.

The above-mentioned anticorrosion is described in more detail. If not covered with the anticorrosion functional film 514, a problem occurs that after the product is completed, when corrosive liquid such as sweat or salt water enters from the outside, or under a test environment such as high temperature and high humidity, corrosion of the light blocking conductive film 512 of the fine wiring circuit pattern 511 proceeds so that the electric characteristics are deteriorated. In contrast, when covered with the anticorrosion functional film 514 like the present invention, even if corrosive liquid enters from the outside after the product is completed, or even under a test environment such as high temperature and high humidity, corrosion of the wiring circuit does not proceed, so that electric characteristics can be maintained. Therefore, the present invention can be used appropriately in an application in which the wiring circuit is required to be thin and to have a low resistance for a long period, like a touch input sheet used for a capacitance type touch sensor. In addition, if the terminal portion 513 is covered with the anticorrosion functional film 514, it cannot be connected electrically to the FPC 540. Therefore, the terminal portion 513 cannot be covered with the anticorrosion functional film 514, but in this case, the light blocking conductive film in the terminal portion 513 would be corroded (see FIG. 20). Therefore, it is necessary to form a conformal coat 560 after the connection with the FPC 540 (see FIG. 21), which causes an increase in manufacturing cost because of the additional work time and material. However, in the case of the present invention, utilizing the etching step for removing the light blocking conductive film 512 of the electrode pattern, the light blocking conductive film 512 of the terminal portion 513 is also removed so that the anticorrosive transparent conductive film 509 is revealed. Thus, anticorrosion of the terminal portion 513 can be achieved without additional manufacturing cost.

Note that as a method of forming the anticorrosion functional film 514, a method of photoprocess can be adopted. Specifically, the second photoresist layer 518 is removed by the resist release liquid so that the light blocking conductive film 512 is revealed (see FIG. 19(*h*)). Then, the third photoresist layer 528 is formed on the entire surface on which the electrode pattern 510 and the fine wiring circuit pattern 511 are formed (see FIG. 19(*i*)). After that, the mask 529 is placed, and exposure (see FIG. 19(*j*)) and development are performed so as to pattern the third photoresist layer 528 to cover the light blocking conductive film 512, which results in the anticorrosion functional film 514 (see FIG. 19(*k*)). Note that the position of the mask 529 illustrated in FIG. 19(*j*) indicates the case where the third photoresist layer 528 is a negative type (when it is exposed, its solubility is decreased with respect to developing solution so that an exposed part remains after development).

In addition, as a method of forming the anticorrosion functional film 514, a printing method may be used. Specifically, the second photoresist layer 518 is removed by resist release liquid, and the light blocking conductive film 512 is revealed (see FIG. 19(h)). After that, the anticorrosion functional film 514 is printed so as to cover the revealed light blocking conductive film 512 (see FIG. 19(k)).

End portions of the fine wiring circuit patterns 511 formed on both sides of the touch input sheet 501 obtained by the method described above are connected to the FPC 540 at the terminal portions 513. Thus, the capacitance type touch sensor is manufactured, in which the electrode patterns 510 made of the transparent conductive film 509 are formed on both sides of the resin sheet 506.

Next, the individual layers forming the touch input sheet 501 are described in detail.

First, the base sheet is made of a transparent sheet having a thickness of approximately 30 to 2,000 μm, and its material may be the resin sheet 506 of polyester resin, polystyrene resin, olefin resin, polybutylene terephthalate resin, polycarbonate resin, acrylic resin, or the like.

The transparent conductive film 509 may be a layer made of metal oxide such as indium tin oxide, zinc oxide, and the like, and can be formed by a vacuum deposition method, a sputtering method, an ion plating method, a plating method, or the like. The thickness is approximately a few tens to a few hundreds nanometers. It is necessary that the transparent conductive film 509 is easily etched in a solution of ferric chloride or the like together with the light blocking conductive film 512 but cannot be easily etched by the etching liquid of the light blocking conductive film 512 such as the hydrogen peroxide water in an acid atmosphere. Further, it is preferred that the transparent conductive film 509 has a light transmittance of 80% or higher and a surface resistance of a few milliohms to a few hundreds ohms. In addition, the transparent conductive film 509 may be made of an electrically conductive polymer film of thiophene or the like, or a conductive fiber film including metal nano wires or carbon nanotubes. In this case, the transparent conductive film 509 can be formed by various printing methods or painting methods.

The light blocking conductive film 512 may be a layer made of a single metal film having high electrical conductivity and a good light blocking property, or a layer made of an alloy or a compound thereof, and can be formed by a vacuum deposition method, a sputtering method, an ion plating method, a plating method, or the like. Further, it is necessary to have an etchant that does not etch the transparent conductive film 509 but etches the light blocking conductive film 512 itself. As an example of the preferred metal, there are aluminum, nickel, copper, silver, tin, and the like. In particular, a metal film made of copper foil having a thickness of 20 to 1,000 nm is further preferable because it has a good electrical conductivity and light blocking property, and because the transparent conductive film 509 can be easily etched by hydrogen peroxide water in an non-etchable acid atmosphere, and because it is easily connected to the FPC 540. More preferably, the thickness is 30 nm or larger. Still more preferably, the thickness is 100 to 500 nm. It is because a light blocking conductive film 512 having high electrical conductivity can be obtained by setting the thickness to 100 nm or larger, while a light blocking conductive film 512 that can be easily handled and has a good processability can be obtained by setting the thickness to 500 nm or smaller.

The first photoresist layer 516 may be made of an acrylic photoresist material having a thickness of 10 to 20 μm that can be exposed by a high pressure mercury-vapor lamp, a super high pressure mercury-vapor lamp, a laser beam, or a metal halide lamp, and can be developed by alkali solution or the like. It is because that the fine wiring circuit pattern 511 having a thin width can be reliably formed by exposure and development using the photoresist material and the touch input sheet 501 having a thinner bezel can be manufactured. It is preferred to form the first photoresist layer 516 by a general printing method such as gravure printing, screen printing, or offset printing, various coating methods, a painting method, a dipping method, a dry film resist method, or other various methods, across the entire surface. After that, exposure and development are performed for patterning. Among the methods, the dry film resist method is more preferred.

A dry film resist (DFR) used in the dry film resist method is a film in which a photosensitive layer to be the first photoresist layer 516 is sandwiched between a base film and a cover film. The above-mentioned printing method, coating method, painting method, and the like have a problem that only one side may be coated, so that efficiency is low. In contrast, the dry film resist method has a high productivity and can support various requirements so as to go mainstream, because it is a method that involves gluing the photosensitive layer through a heating roll after removing the cover film. Note that the exposure is usually performed by placing the mask on the base film (not shown), and the development is performed after the base film is removed. The base film of the dry film resist may be made of polyethylene terephthalate or the like. In addition, the cover film of the dry film resist may be made of polyethylene or the like.

Materials and method for forming the second photoresist layer 518 can be the same as those for forming the first photoresist layer 516.

If the anticorrosion functional film 514 is formed by photoprocess, it is preferred to use the photoresist material that is similar to that of the first photoresist layer 516, with an anticorrosion agent added, as the third photoresist layer 528, or to use the above-mentioned photoresist material that has a good anticorrosion property as the third photoresist layer 528. In addition, the method for forming the third photoresist layer 528 may be the same as that for forming the first photoresist layer 516. In addition, if the anticorrosion functional film 514 is formed by the printing method, it is preferred to use ink containing an anticorrosion agent. As the anticorrosion agent, a material that is known as an anticorrosion agent may be used. For instance, there are imidazole, triazole, benzotriazole, benzimidazole, benzothiazole, pyrazole, or the like. In addition, there are a monocyclic or polycyclic azole group such as halogen of these, alkyl or phenyl substituent, an aromatic amine group such as aniline, aliphatic amine such as alkyl amine, and a salt thereof. In addition, there is no need to limit the material particularly to the materials described in this description.

Although an example of the touch input sheet is described above, the present invention is not limited to this. For instance, the base sheet is not limited to the illustrated one constituted of the single layer of the resin sheet 506, but it is possible to laminate a plurality of the resin sheets 506 so as to use the laminated body as the base sheet. In this case, as means for laminating the resin sheets 506, there are thermal lamination, dry lamination using an adhesive layer, and the like. When using the adhesive layer for laminating the resin sheets 506, it is possible to use the adhesive layer having a core so as to adjust thickness of the entire laminated body. In addition, the laminating of the resin sheets 506 may be performed at any time after forming the transparent conductive film 509 on the resin sheet 506, after laminating the light blocking conductive film 512, or after laminating the first photoresist layer 516.

Example 1

As the base sheet, a colorless transparent polyester film having a thickness of 100 μm was used. On both the front and back sides of the base sheet, transparent conductive films made of indium tin oxide were formed by the sputtering method to have a thickness of 200 nm. On the conductive films, copper films as the light blocking conductive films were formed by the sputtering method to have a thickness of 300 nm. On the copper films, the first resist layers made of novolac resin were formed by gravure printing coating. On the front side, the mask having the electrode pattern of the X direction was placed. On the rear side, the mask having the electrode pattern of the Y direction was placed. Then, the front and back sides were exposed simultaneously using the metal halide lamp and were developed by dipping in the alkali solution.

Next, the indium tin oxide film and the copper film were simultaneously etched with etching liquid of ferric chloride. Then, the electrode pattern of the X direction was revealed and formed on the front surface while the electrode pattern of the Y direction was revealed and formed on the rear surface in the center window. In the outer frame surrounding the center window, the fine wiring patterns having an average line width of 20 μm were revealed and formed on both the front and back sides. Next, thermosetting acrylic resin layers were formed as the second resist layers having a thickness of 10 μm by screen printing so as to cover the fine wiring patterns. Next, when dipping in the hydrogen peroxide water in an acid atmosphere, the revealed copper films in the center window were etched and removed, so that only the indium tin oxide films formed thereunder remained.

Next, a thermosetting acrylic resin layers were formed as the anticorrosion layers having a thickness of 10 μm by screen printing so as to cover the transparent electrode patterns in the center window and the thermosetting acrylic resin layers in the outer frame formed on both sides. By the method described above, the narrow frame touch input sheet was obtained, in which only the indium tin oxide films of the electrode pattern of the X direction and the electrode pattern of the Y direction were formed on both sides of the base sheet in the center window, the fine wiring circuit made of the indium tin oxide film and the copper film formed thereon in the same pattern was formed on each side of the outer frame, the thermosetting acrylic resin layer was formed to cover the fine wiring circuit, and the transparent anticorrosion layer is formed to cover the transparent electrode pattern and the thermosetting acrylic resin layer on each side.

End portions of the fine wiring circuit patterns formed on the obtained narrow frame touch input sheet were connected to the external circuit on which IC chips were mounted, and touch input sheet was evaluated whether or not it worked as a capacitance type touch sensor for a long period. Then, the obtained result indicated that stable electric characteristic was maintained.

Example 2

As two base sheets, colorless transparent polyester film having a thickness of 100 μm was used. The transparent conductive film, the light blocking conductive film, and the first resist layer were sequentially formed on each side of the base sheets, which were laminated so that the surfaces of the base sheets on which the layers were not formed faced each other. Other steps than the step that the transparent conductive film, the light blocking conductive film, and the first resist layer were sequentially formed on both sides of the laminated base sheets were the same as those in the method of Example 1. Thus, the narrow frame touch input sheet was obtained. End portions of the fine wiring circuit patterns formed on this narrow frame touch input sheet were connected to the external circuit on which IC chips were mounted, and the touch input sheet was evaluated whether or not it worked as a capacitance type touch sensor for a long period. Then, the obtained result indicated that stable electric characteristic was maintained.

Example 3

The anticorrosion layer was formed to cover only the thermosetting acrylic resin layer in the outer frame. Other steps were the same as those in the method of Example 1. Thus, the narrow frame touch input sheet was obtained. End portions of the fine wiring circuit patterns formed on this narrow frame touch input sheet were connected to the external circuit on which IC chips were mounted, and the touch input sheet was evaluated whether or not it worked as a capacitance type touch sensor for a long period. Then, the obtained result was that stable electric characteristic was maintained although it was a little inferior to Example 1.

Example 4

As the base sheet, a single colorless polyester film having a thickness of 400 μm was used. On both the front and back sides thereof, the transparent conductive film made of indium tin oxide having a thickness of 200 nm was formed by the sputtering method, on which the light blocking conductive film made of copper film having a thickness of 500 nm was formed by the sputtering method, on which the first resist layer having a thickness of 10 nm was formed across the entire surface using dry film resist having a negative acrylic photosensitive layer that can be developed by soda lye of 1%. Then, the mask having the electrode pattern of the X direction was placed on the front surface, and the mask having the electrode pattern of the Y direction was placed on the rear surface. Then, using a metal halide lamp, both the front and back sides were simultaneously exposed and were dipped in the soda lye of 1% for development.

Next, using the etching liquid of ferric chloride, the indium tin oxide film and the copper film in the parts where the patterned first resist layers were not laminated were simultaneously etched and removed. Then, the electrode pattern of the X direction was revealed and formed on the front surface of the base sheet in the center window, while the electrode pattern of the Y direction was revealed and formed on the rear surface of the same. Further, the fine wiring patterns having an average line width of 20 μm were revealed and formed on both the front and back sides of the outer frame surrounding the center window.

Next, after the first resist layer was removed, using a dry film resist having a negative type acrylic photosensitive layer that can be developed by the soda lye of 1% and contains benzimidazole added as the anticorrosion agent, the second resist layer having a thickness of 10 nm was formed on the entire surface. Then, the masks were placed on the front and back sides of the outer frame except for the terminal portions. Then, both the front and back sides were simultaneously exposed by the metal halide lamp, and were dipped in the soda lye of 1% for development.

Next, when dipping in the hydrogen peroxide water in an acid atmosphere, the revealed copper films in the center window were etched and removed, so that only the indium tin oxide films formed thereunder remained. After that, the second resist layer was not removed but was left as the anticorrosion layer.

Example 5

As the base sheet, two colorless polyester films having a thickness of 200 μm were laminated so that the laminated body was used. Before the polyester films were laminated, the transparent conductive film and the light blocking conductive film had been formed on one surface of each in advance. After the polyester films are laminated, the first resist layers were formed on both sides. Other steps were the same as those in the method of Example 4. Thus, the narrow frame touch input sheet was obtained.

Example 6

As the base sheet, two colorless polyester films having a thickness of 200 μm were laminated so that the laminated body was used. Before the polyester films were laminated, only the transparent conductive film had been formed on one surface of each in advance. After the polyester films were laminated, the light blocking conductive films and the first resist layers were formed on both sides. Other steps were the same as those in the method of Example 4. Thus, the narrow frame touch input sheet was obtained.

Example 7

As the anticorrosion agent added to the second resist layer, benzotriazole was used instead of the benzimidazole of Example 4. Other steps were the same as those in the method of Example 4. Thus, the narrow frame touch input sheet was obtained.

According to the method of Examples 4 to 7, the narrow frame touch input sheet was obtained, in which only the indium tin oxide films of the electrode pattern of the X direction and the electrode pattern of the Y direction were formed on respective sides of the base sheet in the center window, the fine wiring circuit including the copper film formed on the indium tin oxide film, except for the terminal portion, was formed on each side of the outer frame, and the fine wiring circuit is covered with the second resist layer containing the anticorrosion agent, except for the terminal portion. End portions of the fine wiring circuit patterns formed on this narrow frame touch input sheet were connected to the external circuit on which IC chips were mounted, and the touch input sheet was evaluated whether or not it worked as a capacitance type touch sensor. Then, a good result was obtained in each of Examples 4 to 7. In addition, even if corrosive liquid entered from the outside after the product was completed, or even under a test environment such as high temperature and high humidity, corrosion of the wiring circuit did not proceed, so that electric characteristics was maintained.

Example 8

As the base sheet, a colorless transparent polyester film having a thickness of 400 μm was used. On both the front and back sides thereof, the transparent conductive film made of indium tin oxide having a thickness of 200 nm was formed by the sputtering method, on which the light blocking conductive film made of a copper film having a thickness of 500 nm was formed by the sputtering method, on which the first resist layer having a thickness of 10 nm is formed across the entire surface using dry film resist having a negative type acrylic photosensitive layer that can be developed by the soda lye of 1%. Then, the mask having the electrode pattern of the X direction was placed on the front surface, and the mask having the electrode pattern of the Y direction was placed on the rear surface. Then, using a metal halide lamp, both the front and back sides were simultaneously exposed and were dipped in the soda lye of 1% for development.

Next, using the etching liquid of ferric chloride, the indium tin oxide film and the copper film in the parts where the patterned first resist layers were not laminated were simultaneously etched and removed. Then, the electrode pattern of the X direction was revealed and formed on the front surface of the base sheet in the center window, while the electrode pattern of the Y direction was revealed and formed on the rear surface of the same. Further, the fine wiring patterns having an average line width of 20 μm were revealed and formed on both the front and back sides of the outer frame surrounding the center window.

Next, after the first resist layer was removed, using a dry film resist having a negative type acrylic photosensitive layer that can be developed by the soda lye of 1% and contains benzimidazole added as the anticorrosion agent, the second resist layer having a thickness of 10 nm was formed on the entire surface. Then, the masks were placed on the front and back sides of the outer frame except for the terminal portions. Then, both the front and back sides were simultaneously exposed by the metal halide lamp, and were dipped in the soda lye of 1% for development.

Next, when dipping in the hydrogen peroxide water in an acid atmosphere, the revealed copper films in the center window were etched and removed, so that only the indium tin oxide films formed thereunder remained. When etching is further continued, side etching of the revealed end face of the light blocking conductive film was performed at boundaries with the center window and with the terminal portion so that the second resist layer had the visor structure.

Finally, the second resist layer of the visor structure was softened by heat treatment so as to cover the revealed end face of the remaining light blocking conductive film, and in this state, the second resist layer was not removed but was left as the anticorrosion layer.

Example 9

As the base sheet, two colorless polyester films having a thickness of 200 μm were laminated so that the laminated body was used. Before the polyester films were laminated, the transparent conductive film and the light blocking conductive film had been formed on one surface of each in advance. After the polyester films were laminated, the first resist layers were formed on both sides. Other steps were the same as those in the method of Example 8. Thus, the narrow frame touch input sheet was obtained.

Example 10

As the base sheet, two colorless polyester films having a thickness of 200 μm were laminated so that the laminated body was used. Before the polyester films were laminated, only the transparent conductive film had been formed on one surface of each in advance. After the polyester films were laminated, the light blocking conductive films and the first resist layers were formed on both sides. Other steps were the same as those in the method of Example 8. Thus, the narrow frame touch input sheet was obtained.

Example 11

As the anticorrosion agent added to the second resist layer, benzotriazole was used instead of the benzimidazole of Example 8. Other steps were the same as those in the method of Example 8. Thus, the narrow frame touch input sheet was obtained.

According to the method of Examples 8 to 11, the narrow frame touch input sheet was obtained, in which only the indium tin oxide films of the electrode pattern of the X direction and the electrode pattern of the Y direction were formed on respective sides of the base sheet in the center window, the fine wiring circuit including the copper film formed on the indium tin oxide film, except for the terminal portion, and the side etched portion was formed on each side of the outer frame, and the fine wiring circuit was covered with the second resist layer containing the anticorrosion agent, except for the terminal portion. End portions of the fine wiring circuit patterns formed on this narrow frame touch input sheet were connected to the external circuit on which IC chips were mounted, and the touch input sheet was evaluated whether or not it worked as a capacitance type touch sensor. Then, a good result was obtained in each of Examples 8 to 11. In addition, even if corrosive liquid entered from the outside after the product was completed, or even under a test environment such as high temperature and high humidity, corrosion of the wiring circuit did not proceed, so that electric characteristics was maintained.

Example 12

A colorless polyester film having a thickness of 200 μm drawn out from a roll was used as the base sheet. On one surface thereof, the transparent conductive film made of indium tin oxide having a thickness of 200 nm was formed by the sputtering method, on which the light blocking conductive film made of a copper film having a thickness of 500 nm was formed by the sputtering method. Next, a set of conductive films were laminated using transparent adhesive so as to form a laminated body having a transparent conductive film and a light blocking conductive on both sides. Then, using a dry film resist having a negative type acrylic photosensitive layer that can be developed by the soda lye of 1%, the first photoresist layer having a thickness of 10 nm was formed on each side of the laminated body across the entire surface. Then, the mask having the electrode pattern of the X direction was placed on the front surface, and the mask having the electrode pattern of the Y direction was placed on the rear surface. Then, using a metal halide lamp, both the front and back sides were simultaneously exposed and were dipped in the soda lye of 1% for development.

Next, using the etching liquid of ferric chloride, the indium tin oxide film and the copper film in the parts where the patterned first photoresist layers were not laminated were simultaneously etched and removed. Then, the electrode pattern of the X direction was revealed and formed on the front surface of the base sheet in the center window, while the electrode pattern of the Y direction was revealed and formed on the rear surface of the same. Further, the fine wiring patterns having an average line width of 20 μm were revealed and formed on both the front and back sides of the outer frame surrounding the center window.

Next, after the first photoresist layer was removed, using a dry film resist having a negative type acrylic photosensitive layer that can be developed by the soda lye of 1%, the second photoresist layers having a thickness of 10 nm were formed on the entire surface of both sides, on which the masks were placed on the front and back sides of the outer frame, except for the terminal portion. Then, using a metal halide lamp, both the front and back sides were simultaneously exposed and were dipped in the soda lye of 1% for development.

Next, when dipping in the hydrogen peroxide water in an acid atmosphere, the revealed copper films in the center window were etched and removed, so that only the indium tin oxide films formed thereunder remained.

Next, after the second photoresist layer was removed, using a dry film resist having a negative type acrylic photosensitive layer that can be developed by the soda lye of 1% and contains benzimidazole added as the anticorrosion agent, the third photoresist layers having thickness of 10 nm were formed on the entire surface of both sides. Then, the masks were placed thereon on the front and back sides of the outer frame, except for the terminal portion, and both the front and back sides simultaneously were exposed using the metal halide lamp. Then, it was dipped in the soda lye of 1% for development, and the remained third photoresist layer was used as an anticorrosion function layer.

Example 13

The anticorrosion function layer was directly patterned and formed by screen printing using anticorrosion ink instead of the photoprocess. Other steps were the same as those in the method of Example 12, and the touch input sheet was obtained.

According to the method of Example 12 or Example 13, the touch input sheet was obtained, in which only the indium tin oxide films of the electrode pattern of the X direction and the electrode pattern of the Y direction were formed on respective sides of the base sheet in the center window, the fine wiring circuit including the copper film formed on the indium tin oxide film, except for the terminal portion, was formed on each side of the outer frame, and the fine wiring circuit was covered with the anticorrosion functional film, except for the terminal portion. End portions of the fine wiring circuit patterns formed on this touch input sheet were connected to the FPC, and the touch input sheet was evaluated whether or not it worked as a capacitance type touch sensor. Then, a good result was obtained in each case of Example 12 and Example 13. In addition, even if corrosive liquid entered from the outside after the product was completed, or even under a test environment such as high temperature and high humidity, corrosion of the wiring circuit did not proceed, so that electric characteristics was maintained.

Although the present invention is sufficiently described with reference to the preferred embodiments and the attached drawings, various modifications and revisions are obvious for skilled persons in the art. Such modifications and revisions should be interpreted to be included in the scope of the present invention unless deviating from the scope of the attached claims.

INDUSTRIAL APPLICABILITY

The present invention is an invention related to a manufacturing method of a narrow frame touch input sheet that can be used for an input device such as a mobile phone, a PDA, or a small PC including an image screen such as a liquid crystal panel.

The invention claimed is:
1. A both-side transparent conductive film sheet having a good anticorrosion property, comprising:
   a transparent base sheet having a center window on both sides;
   an electrode pattern of a transparent conductive film formed in the windows on both sides; and
   a fine wiring circuit patterns for the electrode pattern formed on both sides of an outer frame of the base sheet, wherein the electrode patterns and the fine wiring circuit patterns are different between both sides, and at least the fine wiring circuit pattern, except a terminal portion thereof, on at least one side of the transparent base sheet is covered with a transparent anticorrosion layer.

2. A both-side transparent conductive film sheet having a good anticorrosion property according to claim 1, wherein each of the fine wiring circuit patterns includes a transparent conductive film and a light blocking conductive film that are laminated in order.

3. A both-side transparent conductive film sheet having a good anticorrosion property according to claim 1, wherein the transparent anticorrosion layer is formed to cover also the electrode pattern.

4. A both-side transparent conductive film sheet having a good anticorrosion property according to claim 1, wherein the transparent anticorrosion layer is made of thermosetting resin or photo-setting resin.

5. A both-side transparent conductive film sheet having a good anticorrosion property according to claim 1, wherein the base sheet has a two-layer structure.

6. A both-side transparent conductive film sheet having a good anticorrosion property according to claim 1, further comprising an external circuit on which IC chips are mounted, the external circuit being connected to the terminal portion of the fine wiring circuit pattern, so that the touch input sheet functions as a capacitance type touch sensor.

7. A both-side transparent conductive film sheet having a good anticorrosion property according to claim 1, wherein all of a top surface of the fine wiring circuit pattern, except the terminal portion thereof, is covered with the transparent anticorrosion layer.

* * * * *